US009006582B2

(12) United States Patent
Tojo et al.

(10) Patent No.: US 9,006,582 B2
(45) Date of Patent: Apr. 14, 2015

(54) CERAMIC SUBSTRATE AND PROCESS FOR PRODUCING SAME

(71) Applicant: NGK Spark Plug Co., Ltd., Nagoya, Aichi (JP)

(72) Inventors: Takatoshi Tojo, Nishikasugai-gun (JP); Shinji Suzumura, Kani (JP); Yoshitaka Yoshida, Kounan (JP); Masahiro Ogawa, Kounan (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 14/235,529

(22) PCT Filed: Mar. 12, 2013

(86) PCT No.: PCT/JP2013/056707
§ 371 (c)(1),
(2) Date: Jan. 28, 2014

(87) PCT Pub. No.: WO2013/137214
PCT Pub. Date: Sep. 19, 2013

(65) Prior Publication Data
US 2014/0196935 A1    Jul. 17, 2014

(30) Foreign Application Priority Data

Mar. 14, 2012   (JP) ................................. 2012-056593
Nov. 6, 2012    (JP) ................................. 2012-244442

(51) Int. Cl.
*H05K 1/03*   (2006.01)
*H01L 23/10*  (2006.01)
(Continued)

(52) U.S. Cl.
CPC ......... *H05K 1/0306* (2013.01); *Y10T 29/49165* (2015.01); *Y10T 29/49155* (2015.01);
(Continued)

(58) Field of Classification Search
CPC ........ H05K 3/244; H01L 33/00; H01L 33/20; H01L 33/52; H01L 33/56; H01L 39/24; G06T 1/00
See application file for complete search history.

(56) References Cited

U.S. PATENT DOCUMENTS 5,010,053 A * 4/1991 Maroni ......................... 505/230
5,079,223 A * 1/1992 Maroni ......................... 505/473
(Continued)

FOREIGN PATENT DOCUMENTS

| JP | 36-6542 B     | 6/1961 |
| JP | H01-197378 A  | 8/1989 |
| JP | 05-166958 A   | 7/1993 |

(Continued)

OTHER PUBLICATIONS

Japanese Patent Office, Notification of Reason for Rejection issued in corresponding Japanese application No. 2013-523801, dispatched Jul. 23, 2014.

(Continued)

*Primary Examiner* — Xiaoliang Chen
(74) *Attorney, Agent, or Firm* — Stites & Harbison PLLC; Jeffrey A. Haeberlin

(57) ABSTRACT

A ceramic substrate includes a substrate body formed of ceramic and having a pair of surfaces each assuming a rectangular shape as viewed in plane, and a metallization layer formed on the surface of the substrate body and adapted to braze a metal frame thereon. A composite material layer is disposed between the surface of the substrate body and the metallization layer and is formed such that a ceramic portion, a metal portion 10*m* formed of a metal similar to a metal component of the metallization layer or a metal which, together with a metal component of the metallization layer, forms an all proportional solid solution, and a glass portion exist together. The thickness of the composite material layer is thinner than that of the metallization layer. A plating layer is deposited on the surface of the metallization layer.

13 Claims, 10 Drawing Sheets

(51) Int. Cl.
*H05K 3/10* (2006.01)
*H01L 23/08* (2006.01)

(52) U.S. Cl.
CPC ................ *H01L23/08* (2013.01); *H01L 23/10* (2013.01); *H05K 3/10* (2013.01); *H01L 2924/15174* (2013.01); *H01L 2924/15312* (2013.01); *H01L 2224/16225* (2013.01)

(56) References Cited

U.S. PATENT DOCUMENTS

| | | | |
|---|---|---|---|
| 5,825,086 A | 10/1998 | Kimura et al. | |
| 2004/0023011 A1 | 2/2004 | Sumi et al. | |
| 2005/0199506 A1* | 9/2005 | Toben et al. | 205/253 |
| 2010/0015370 A1 | 1/2010 | Kanechika et al. | |
| 2013/0050228 A1* | 2/2013 | Petersen et al. | 345/501 |

FOREIGN PATENT DOCUMENTS

| | | |
|---|---|---|
| JP | H09-221375 A | 8/1994 |
| JP | 7-66315 A | 3/1995 |
| JP | H08-181441 A | 7/1996 |
| JP | 09-139439 A | 5/1997 |
| JP | H11-214582 A | 8/1999 |
| JP | 2001-068830 A | 3/2001 |
| JP | 2004-056148 A | 2/2004 |
| JP | 2007-12707 A | 1/2007 |
| JP | 2007-294795 A | 11/2007 |
| JP | 2008-186967 A | 8/2008 |
| JP | 2009-283510 A | 12/2009 |
| JP | 2011-035340 A | 2/2011 |
| JP | 2011-241117 A | 12/2011 |
| WO | 2008/050722 A1 | 5/2008 |

OTHER PUBLICATIONS

JPO, International Search Report issued in corresponding international application No. PCT/JP2013/056707, mailed Apr. 23, 2013.

\* cited by examiner

CERAMIC SUBSTRATE AND PROCESS FOR PRODUCING SAME

TECHNICAL FIELD

The present invention relates to a ceramic substrate on a substrate body of which, for example, an electronic component, such as a crystal oscillator, a semiconductor device, or a piezoelectric element, or metal members such as lead pins are to be mounted, and to a method of manufacturing the ceramic substrate.

BACKGROUND ART

For example, there has been proposed a ceramic package sealing structure in which a wide metallization layer is formed on a rectangular-frame-shaped front surface surrounding the opening of a cavity of a ceramic package and which, by means of a seal ring (metal frame) being brazed on an elongated protrusion and on a brazing material charged in a brazing material pool formed on the upper surface of the metallization layer, exhibits improved brazing strength of the brazing material even though a peripheral portion of a metal lid (cap) is welded onto the ring (refer to, for example, Patent Document 1).

Also, there has been proposed a semiconductor device accommodation package in which, by means of a metallization layer having a thickness of 25 µm or more being formed on a rectangular-frame-shaped front surface of a box-like electrically insulating substrate made of ceramic or the like, the front surface surrounding the opening of a concave portion (cavity), the metallization layer absorbs thermal stress generated as a result of seam-welding a metal lid onto a metal frame brazed on the upper surface of the metallization layer, thereby preventing separation of the metallization layer from the front surface of the electrically insulating substrate and enhancing the reliability of a seal for airtightness in the concave portion where a semiconductor device is mounted (refer to, for example, Patent Document 2).

However, in the case of the ceramic package sealing structure described in Patent Document 1, in contrast to improvement in brazing strength of the metal frame, when the metal lid placed on the metal frame is seam-welded for sealing the cavity, generation of resistance heat resulting from the seam welding causes generation of stress stemming from the difference in thermal expansion coefficient between the metallization layer and ceramic used to form the package body, and the stress acts on the metallization layer; as a result, the metallization layer is apt to be separated from the front surface of the package. Thus, there has arisen a problem of a failure to provide a seal by the metal lid or a failure to maintain an airtight seal for a long period of time.

Also, the semiconductor device accommodation package described in Patent Document 2 has involved the following problem: in many cases, the thick metallization layer fails to sufficiently absorb thermal stress generated as a result of seam-welding the metal lid onto the metal frame; additionally, difficulty is encountered in reducing the size of the entire package.

Furthermore, in order to solve the above problems, the following method has been proposed: in order to strongly coat the surface of ceramic of the package or the like with the metallization layer, a fine ceramic powder having a large reaction surface area and a high melting point is used as an additive of a metal paste, and the metal paste is applied onto the surface of alumina ceramic and undergoes baking so as to form a metal coating having strong adhesion on the alumina ceramic (refer to, for example, Patent Document 3).

However, as in the case of the method described in Patent Document 3, when a metal paste which contains ceramic powder is applied onto ceramic and then undergoes baking, in some cases, a glass component contained as an additive in the metal paste is deposit substantially in a planar form on the surface of the metallization layer after baking; i.e., so-called "glass surfacing" arises. As a result, the following problem has been involved: adhesion strength between the metallization layer and a plating layer formed on the surface of the metallization layer drops, resulting in occurrence of a defect, such as separation of plating or plating blister; therefore, when the metal lid and the metal frame are brazed onto the plating layer, joining strength thereof is apt to drop.

PRIOR ART DOCUMENTS

Patent Documents

Patent Document 1: Japanese Patent Application Laid-Open (kokai) No. H09-139439 (pages 1 to 6, FIGS. 1 to 6).
Patent Document 2: Japanese Patent Application Laid-Open (kokai) No. H05-166958 (pages 1 to 4, FIGS. 1 and 2).
Patent Document 3: Japanese Patent Publication (kokoku) No. S36-6542 (pages 1 and 2).

SUMMARY OF THE INVENTION

Problem to be Solved by the Invention

An object of the present invention is to solve the problems described in the section TECHNICAL FIELD and to provide a ceramic substrate having a surface of a substrate body which is formed of ceramic and on which an electronic component or the like is to be mounted, and a metallization layer formed on the surface, and configured such that, for example, when a metal lid or the like is welded onto a metal frame (metal component) brazed onto the metallization layer, there does not arise separation of the metallization layer from the substrate body caused by shrinkage stress of the metal lid induced by heat of the welding and such that strong adhesion is established between the metallization layer and the substrate body, as well as a method of manufacturing the ceramic substrate.

Means for Solving the Problem and Effects of the Invention

In order to solve the above problem, the present invention has been conceived according to the following idea: a composite material layer composed of a ceramic portion, a metal portion, and a glass portion is formed between a surface of the substrate body formed of ceramic and the metallization layer to be formed on the surface, and the thickness of the composite material layer is rendered thinner than that of the metallization layer.

Specifically, a ceramic substrate of the present invention (claim 1) comprises a substrate body formed of ceramic and having a pair of surfaces each assuming a rectangular shape as viewed in plane, and a metallization layer formed on at least one of the surfaces of the substrate body and adapted to mount a metal member thereon, and is characterized in that a composite material layer is formed between the surface of the substrate body and the metallization layer and is formed such that a ceramic portion, a metal portion formed of a metal similar to a metal component of the metallization layer or a metal which, together with a metal component of the metallization layer, forms an all proportional solid solution, and a glass portion exist together, a thickness of the composite material layer is thinner than a thickness of the metallization layer, and a plating layer is deposited on a surface of the metallization layer.

This configuration can yield the following effects (1) to (4).

(1) Since the metallization layer is thicker than the composite material layer, even when the substrate body formed of ceramic and having the metallization layer and the composite material layer is fired, there is unlikely to arise substantially planar deposition of a glass component contained in the composite material layer on the surface of the metallization layer after the firing; i.e., so-called glass surfacing is unlikely to arise. As a result, adhesive strength between the metallization layer and the plating layer deposited on the surface of the metallization layer can be maintained; therefore, a defect, such as separation of plating or plating blister, can be readily prevented.

(2) Since the composite material layer composed of a metal portion, a ceramic portion, and a glass portion is located between the metallization layer and the surface of the substrate body formed of ceramic, although, for example, when a metal frame (metal member) is brazed onto the metallization layer and when a metal member such as a metal lid plate is welded onto the upper surface of the metal frame, postheating shrinkage stress is generated in the metal member, the metallization layer is unlikely to separate from ceramic of the substrate body.

(3) Since the composite material layer composed of a metal portion, a ceramic portion, and a glass portion is located between the metallization layer and the surface of the substrate body formed of ceramic, for example, when metal members, such as lead pins and a heat radiation plate, are brazed onto the metallization layer, the metal members do not separate from the metallization layer and can be firmly joined to the metallization layer.

(4) By virtue of the above effects (1) to (3), there can be provided a highly reliable ceramic wiring substrate in which the metallization layer is formed on at least one of two surfaces of the substrate body formed of ceramic and in which the plating layer firmly adheres to the surface of the metallization layer.

The composite material layer is rendered thinner than the metallization layer for the following reason: if the two layers have the same thickness or if the composite material layer is thicker than the metallization layer, glass is apt to educe at the surface of the metallization layer after firing.

The ceramic mentioned above is, for example, a high-temperature-fired ceramic, such as alumina, mullite, or aluminum nitride, or a low-temperature-fired ceramic such as glass-ceramic.

A pair of surfaces mentioned above is a relative expression and indicates the front surface and the back surface of the flat-plate-like substrate body.

Furthermore, in the case where the substrate body is formed of a high-temperature-fired ceramic, the metallization layer is an electrically conductive layer which contains, for example, W or Mo as a main component. In the case where the substrate body is formed of a low-temperature-fired ceramic, the metallization layer is an electrically conductive layer which contains, for example, Cu or Ag as a main component.

Also, the composite material layer is a flat layer formed such that a ceramic portion, a metal portion, and a glass portion exist together, and the ceramic portion, the metal portion, and the glass portion are not unevenly distributed, but are substantially evenly mixed.

Furthermore, the glass portion contained in the composite material layer is a glass component composed of at least one of, for example, $SiO_2$, $MgCO_3$, $BaCO_3$, MgO, BaO, $CaCO_3$, and CaO and assumes a form in which the glass portion is contained in the ceramic portion beforehand or a form in which the glass portion is added in a predetermined amount to the metal portion and the ceramic portion. In the form in which the glass portion is contained in the ceramic portion; for example, in the case where the ceramic portion is composed of alumina and the glass portion, the glass portion is contained in an amount of about 2 volume (vol) % to 20 volume (vol) % of the ceramic portion.

Also, the composite material layer may be in the form in which the composite material layer is formed on the entire surface of the substrate body. According to this form, in the case where the metallization layer has the form of a rectangular frame as viewed in plane, the composite material layer is exposed at a surface of the substrate body surrounded by the metallization layer and serves as a mounting surface for an electronic component.

Furthermore, in the composite material layer, "a metal (including an alloy) similar to a metal component of the metallization layer or a metal which, together with a metal component of the metallization layer, forms an all proportional solid solution" is exemplified by the following forms (a) to (d).

(a) A form in which the metal portion is formed of a metal having the same composition as that of a metal component of the metallization layer; for example, a case where both of the metallization layer and the metal portion of the composite material layer are formed of tungsten (W) or a case where both of the metallization layer and the metal portion of the composite material layer are formed of a tungsten (W)-based alloy.

(b) A form in which the metal portion having a mixed microstructure (a plurality of types of metal particles exist together) contains predominantly (highest content) the same metal as a metal component of the metallization layer; for example, a case where the metallization layer has a mixed microstructure of 80 vol % copper (Cu) particles and 20 vol % tungsten (W) particles, and the metal portion of the composite material layer has a mixed microstructure of 90 vol % tungsten (W) particles and 10 vol % nickel (Ni) particles.

(c) A form in which a predominant (highest content) metal element of an alloy composition is identical to a metal component of the metallization layer; for example, a case where the metallization layer is formed of a W-C alloy, and the metal portion of the composite material layer is formed of a W—Ni alloy.

(d) A metal which, together with a metal component of the metallization layer, forms an all proportional solid solution is exemplified, for example, by a form in which the metallization layer is formed of tungsten (W), and the metal portion of the composite material layer is formed of molybdenum (Mo). There are also a form in which the metallization layer is formed of molybdenum (Mo), and the metal portion of the composite material layer is formed of vanadium (V), chromium (Cr), or niobium (Nb), a form in which the metallization layer is formed of copper (Cu), and the metal portion of the composite material layer is formed of nickel (Ni), and a form in which the metallization layer is formed of silver (Ag), and the metal portion of the composite material layer is formed of gold (Au). Furthermore, forms which employ reverse combinations of the above forms are also possible; for example, there is a form in which the metallization layer is formed of gold (Au), and the metal portion of the composite material layer is formed of silver (Ag).

Also, example forms of the plating layer include a form in which the plating layer is formed of only a Ni plating layer and a form in which the plating layer is composed of a lower Ni plating film and an upper Au plating film.

Additionally, examples of the metal component mentioned above include a metal frame to be joined onto the metallization layer by brazing or the like, and a metal lid, lead pins, and a heat radiation plate which are welded onto the metal frame.

Also, the present invention encompasses a ceramic substrate wherein the composite material layer is formed on the entirety of the surface of the substrate body (claim 2).

According to this configuration, since the composite material layer is formed on the entirety of the surface of the substrate body, in addition to the effects (1) to (4) mentioned above, there can be restrained separation of the metallization layer regardless of the shape and position (location) of the metallization layer formed on the upper surface of the composite material layer. As a result, there can be reliably sealed an electronic component mounted on an upper surface of the composite material layer, which is formed on the surface, surrounded by the metallization layer and the metal frame, and there can be readily provided a ceramic substrate in which the heat radiation plate and the lead pins are brazed onto the metallization layer at predetermined positions and in predetermined postures.

Furthermore, the present invention encompasses a ceramic substrate wherein a cavity having a rectangular shape as viewed in plane opens at a central portion of the surface of the substrate body, and the metallization layer and the composite material layer are formed on the surface of the substrate body at a portion excluding the cavity (claim 3).

According to this configuration, since the composite material layer is formed between the metallization layer and the surface of the substrate body excluding the cavity which opens at the surface, in addition to the effects (1) and (4) mentioned above, for example, there can be prevented separation of the metallization layer which could otherwise result from post-heating shrinkage stress in brazing a metal frame, a heat radiation plate, or the like onto the metallization layer disposed on the upper surface of the composite material layer, or post-heating shrinkage stress in welding a metal lid plate onto the surface of the metal frame.

The substrate body having the cavity opening at its surface assumes the form of a laminate of an upper ceramic layer having the form of a rectangular frame as viewed in plane and a flat-plate-like lower ceramic layer which forms the bottom surface of the cavity.

Also, the ceramic substrate can assume a form such that the substrate body has cavities each having a rectangular shape as viewed in plane and opening at a pair of surfaces, respectively, thereof in a symmetrical manner between the upper and lower sides and such that the composite material layer and the metallization layer are disposed on each of the surfaces.

Also, the present invention encompasses a ceramic substrate wherein a metal frame having a rectangular shape as viewed in plane is joined onto the plating layer via a brazing material (claim 4).

According to this configuration, in addition to the effects (1), (3), and (4) mentioned above, there can be prevented separation, from ceramic of the substrate body, of an outer peripheral portion of the metallization layer whose surface is coated with the plating layer, which could otherwise result from post-welding shrinkage stress in seam-welding a peripheral portion of a metal lid plate onto the surface of the metal frame. Therefore, an electronic component mounted on the surface of the substrate body or on the bottom surface of the cavity opening at the surface of the substrate body can be reliably sealed from the external environment.

The brazing material is, for example, an Ag brazing metal (Ag-15 wt % Cu).

The metal frame is formed of, for example, 42Alloy (Fe-42 wt % Ni), Kovar (Fe-29 wt % Ni-17 wt % Co), or 194Alloy (Cu-2.3 wt %-0.03 wt % P).

Furthermore, the present invention encompasses a ceramic substrate wherein the composite material layer contains the metal portion in an amount of 3 vol % to 20 vol % and the ceramic portion and the glass portion as balance (claim 5).

According to this configuration, in addition to the effects (1) to (4) mentioned above, there can be reliably prevented deposition of another electrically conductive plating layer different from the aforementioned plating layer on the surface of the composite material layer; therefore, an unintended short circuit and an increase in plating cost can be prevented.

The upper limit of the metal portion content is specified as 20 vol % for the following reason: when the metal portion content is in excess of 20 vol %, electroplating current begins to flow through the composite material layer, potentially resulting in formation of an unintended plating layer on the surface of the composite material layer. The upper limit is desirably 15 vol %, more desirably 10 vol %. Meanwhile, the lower limit of the metal portion content is specified as 3 vol % for the following reason: when the metal portion content is less than 3 vol %, restraint of separation of the metallization layer from ceramic of the substrate body may become insufficient.

Also, the present invention encompasses a ceramic substrate wherein the composite material layer contains the metal portion in an amount greater than 20 vol % to 80 vol % and the ceramic portion and the glass portion as balance (claim 6).

According to this configuration, in addition to the effects (1) to (4) mentioned above, separation of the metallization layer from the substrate body can be reliably prevented, and an electrically nonconductive another plating layer different from the aforementioned plating layer can be reliably deposited on the surface of the composite material layer.

The ceramic portion, the metal portion, and the glass portion are prepared by mixing metal particles, ceramic powder, and glass powder whose average particle sizes are similar or in near ranges.

When the metal portion content of the composite material layer is 20 vol % or less, the strength of bonding to the metallization layer drops excessively. Meanwhile, when the metal portion content is in excess of 80 vol %, the bonding strength between the composite material layer and ceramic of the substrate body drops excessively, and a plating layer having such a magnitude as to allow flow of electricity is unintendedly formed on the surface of the composite material layer; therefore, the above-mentioned range is specified. In other words, the ceramic portion in the composite material layer is the remainder after removal of the metal portion and the glass portion, and the ceramic portion improves the bonding strength between the ceramic portion and ceramic of the substrate body.

Furthermore, the present invention encompasses a ceramic substrate wherein the composite material layer is a laminate of one or more partial composite material layers which differ in mixing ratio of the ceramic portion, the metal portion, and the glass portion (claim 7).

According to this configuration, two or three partial composite material layers which differ in mixing ratio of the ceramic portion, the metal portion, and the glass portion are formed between the metallization layer and the surface of the substrate body; for example, a first composite material layer which contains 70 vol % ceramic particles, 27 vol % metal powder, and 3 vol % glass particles can be formed on the side toward the substrate body, and a second composite material layer which contains 50 vol % ceramic particles, 45 vol % metal powder, and 5 vol % glass particles can be formed on the side toward the metallization layer. As a result, in addition to the effects (1), (3), and (4) mentioned above, for example, thermal stress generated by resistance heat generated in seam-welding the metal lid onto the metal frame can be mitigated stepwise more easily. Therefore, there can be provided a ceramic substrate which allows stable sealing by the metal lid.

Additionally, the present invention encompasses a ceramic substrate wherein the composite material layer is formed on the front surface or the back surface of the substrate body at at least four corner portions (claim 8).

According to this configuration, in addition to the effects (1) to (4) mentioned above, for example, the following effect is yielded. A metal lid is welded onto a metal frame as follows: after a ceramic substrate in which the metal lid is placed on the metal frame is clamped on a table, a pair of parallel electrode rollers facing each other above the table is rolled along each pair of parallel sides of the surface of the substrate body for seam welding. Thus, when seam welding is performed twice along the four sides of the metal lid, the generation of resistance heat concentrates at four corner portions where welding loci intersect; therefore, the metallization layer is more likely to be separated at the corner portions than at intermediate portions along the sides. Therefore, by means of forming the composite material layer on the surface of the substrate body at at least four corner portions, the incidence of the separation can be reduced through minimal employment of the composite material layer and manufacturing steps, and a contribution is made toward reduction in size of the ceramic substrate.

Each of the corner portions indicates, on the surface of the substrate body having the form of a rectangular frame as viewed in plane, at least a rectangular region as viewed in plane surrounded by extensions of two adjacent inner side surfaces which partially constitute the cavity, and two adjacent outer side surfaces of the substrate body, or may indicate a substantially L-shaped region as viewed in plane which encompasses the rectangular region, and two extensions which extend at right angles to each other from the rectangular region along the two adjacent sides.

Meanwhile, a first ceramic substrate manufacturing method according to the present invention (claim 9) is a method of manufacturing the above-mentioned ceramic substrate and is characterized by including a step of forming a composite material layer composed of a ceramic portion, a metal portion, and a glass portion on the entirety of at least one surface of a pair of surfaces, each having a rectangular shape as viewed in plane, of a ceramic green sheet, a step of forming a metallization layer on an upper surface of the composite material layer, and a step of depositing a plating layer on a surface of the metallization layer.

According to this method, the composite material layer is formed on the entirety of at least one surface of the green sheet, the metallization layer is formed on the upper surface of the composite material layer, and the plating layer is deposited on the surface of the metallization layer; therefore, the following effects (5) to (8) are yielded.

(5) Even when the substrate body having the metallization layer and the composite material layer is fired, there is unlikely to arise substantially planar deposition of a glass component contained in the composite material layer on the surface of the metallization layer after the firing; i.e., so-called glass surfacing is unlikely to arise. As a result, adhesive strength between the metallization layer and the plating layer deposited on the surface of the metallization layer can be maintained; therefore, a defect, such as separation of plating or plating blister, can be readily prevented.

(6) Influence of printing misalignment of the metallization layer can be restrained.

(7) No plating layer is unintendedly formed, to such an extent as to allow flow of electricity, on an exposed upper surface of the composite material layer where the metallization layer is not formed.

(8) By virtue of the above effects (5) to (7), there can be provided reliably and efficiently at low cost a ceramic substrate in which the metallization layer is unlikely to separate from ceramic of the substrate body even though post-heating shrinkage stress is generated, for example, in brazing a metal member, such as a metal frame, a heat radiation plate, or lead pins, onto the metallization layer and in seam-welding a metal lid plate onto the upper surface of the metal frame.

A step of co-firing the green sheet, the composite material layer, and the metallization layer is performed before the plating step.

Also, a second ceramic substrate manufacturing method according to the present invention (claim 10) is a method of manufacturing the above-mentioned ceramic substrate and is characterized by including a step of forming a composite material layer composed of a ceramic portion, a metal portion, and a glass portion on the entirety of one surface of a pair of surfaces, each having a rectangular shape as viewed in plane, of an upper ceramic green sheet, a step of forming a metallization layer on an upper surface of the composite material layer, a step of punching out, along a thickness direction, a central portion of the upper ceramic green sheet on which the composite material layer and the metallization layer are formed, thereby forming a through-hole having a rectangular shape as viewed in plane, and a step of laminating a flat lower ceramic green sheet to cover the through-hole on a back surface of the upper ceramic green sheet, and a step of depositing a plating layer on the surface of the metallization layer, the surface having a rectangular shape as viewed in plane as a result of performing the step of forming the through-hole.

According to this method, the composite material layer is formed on the entirety of the surface of the upper ceramic green sheet, the metallization layer is formed on the upper surface of the composite material layer, and then a central portion of the green sheet is punched out along the thickness direction; therefore, positional misalignment is unlikely to arise between the composite material layer and the metallization layer which have assumed the form of a rectangular frame as viewed in plane. Thus, in addition to the effects (5) to (8) mentioned above, a required plating layer can be accurately deposited on the surface of the metallization layer, and there can be prevented deposition of such a plating layer as to allow flow of electricity on externally exposed opposite side surfaces of the composite material layer. Therefore, by means of laminating the upper and lower green sheets together, there can be reliably provided a ceramic substrate in which the composite material layer and the metallization layer are disposed in two layers on the entirety of the surface having the form of a rectangular frame as viewed in plane of the substrate body having the cavity at its central portion.

In addition to formation on the entirety of the upper surface of the composite material layer, the metallization layer may be formed in the form of a rectangular frame as viewed in plane along the periphery of the composite material layer. The metallization layer having the form of a rectangular frame may be formed such that the upper surface of the composite material layer is exposed in the form of a narrow strip along the outer periphery of the metallization layer or such that, in the punching step mentioned above, the upper surface of the composite material layer is exposed in the form of a narrow strip along the inner periphery of the metallization layer.

Also, through lamination such that the aforementioned lower green sheet is sandwiched between the two aforementioned upper green sheets each having the through-hole formed by punching, the ceramic substrate may assume a form in which the cavities open at a pair of surfaces, respectively, of the substrate body.

Furthermore, the present invention encompasses the first ceramic substrate manufacturing method (claim 11) wherein, as viewed in plane, the ceramic green sheet is composed of a product region where a plurality of substrate regions which are to become ceramic substrates are juxtaposed adjacently in rows and columns, and an edge portion having the form of a rectangular frame and located around the product region, and the metallization layer is formed along four sides of the composite material layer in each of the substrate regions.

According to this method, in addition to the effects (5) to (8) mentioned above, the aforementioned ceramic substrate can be efficiently manufactured in a plurality of pieces at a time.

Also, the present invention encompasses the second ceramic substrate manufacturing method (claim 12) wherein, as viewed in plane, each of the upper and lower ceramic green sheets is composed of a product region where a plurality of substrate regions which are to become ceramic substrates are juxtaposed adjacently in rows and columns, and an edge portion having the form of a rectangular frame and located around the product region, and the step of forming the through-hole is performed on the upper ceramic green sheet on which the composite material layer and the metallization layer are formed, at a central portion of each of the substrate regions.

According to this method, in addition to the effects (5) to (8) mentioned above, the aforementioned ceramic substrate in which the cavity opens at the surface of the substrate body can be efficiently manufactured in a plurality of pieces at a time.

Additionally, the present invention encompasses a ceramic substrate manufacturing method (claim 13) having a step of joining a metal frame having the form of a rectangular frame as viewed in plane onto the plating layer via a brazing material after completion of the steps mentioned above.

According to this method, in addition to the effects (5) to (7) mentioned above, there can be yielded a ceramic substrate in which the metal frame is firmly joined, via the brazing material, onto the surface of the metallization layer coated with the plating layer and formed on the composite material formed on at least one surface of the substrate body. Therefore, there can be reliably provided a ceramic substrate configured such that, when the metal lid plate is seam-welded along the upper surface of the metal frame, in spite of generation of shrinkage stress, an outer peripheral portion of the metallization layer is unlikely to separate from ceramic of the substrate body.

MODES FOR CARRYING OUT THE INVENTION

Modes for carrying out the present invention will next be described.

Figure 1:
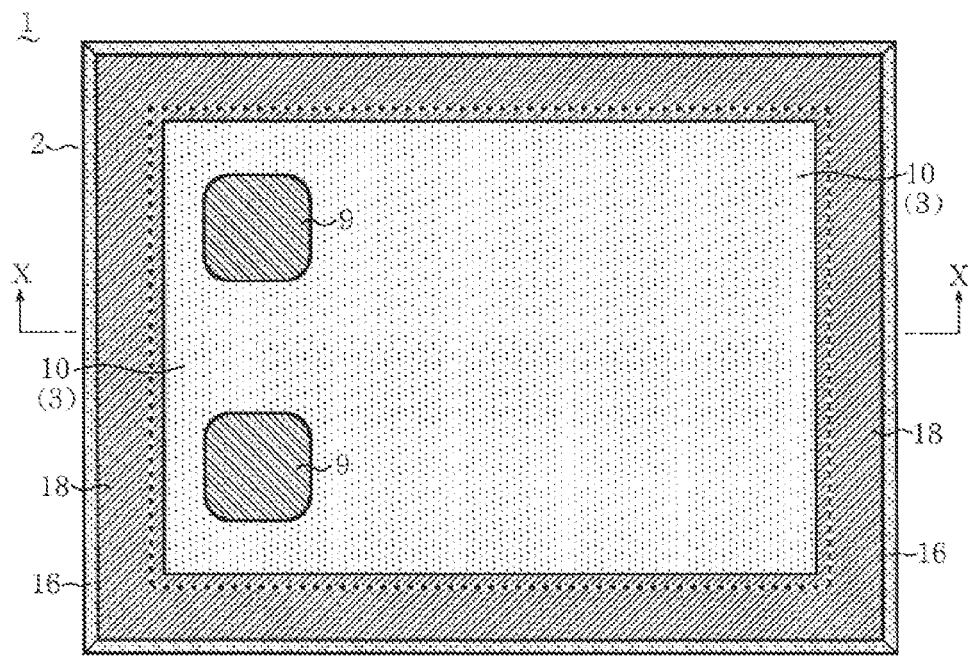
[FIG. 1] Plan view showing a ceramic substrate according to one mode for carrying out the present invention.
Figure 2:
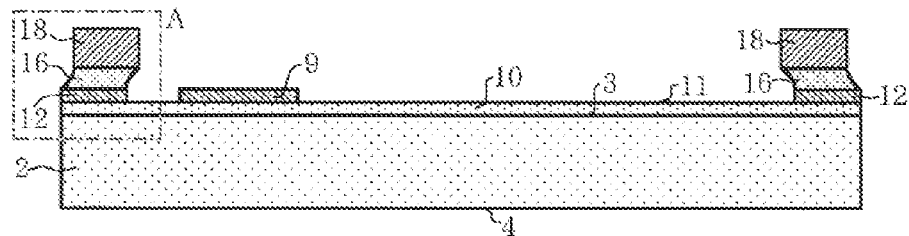
[FIG. 2] Vertical sectional view taken along line X-X in FIG. 1.
Figure 3:
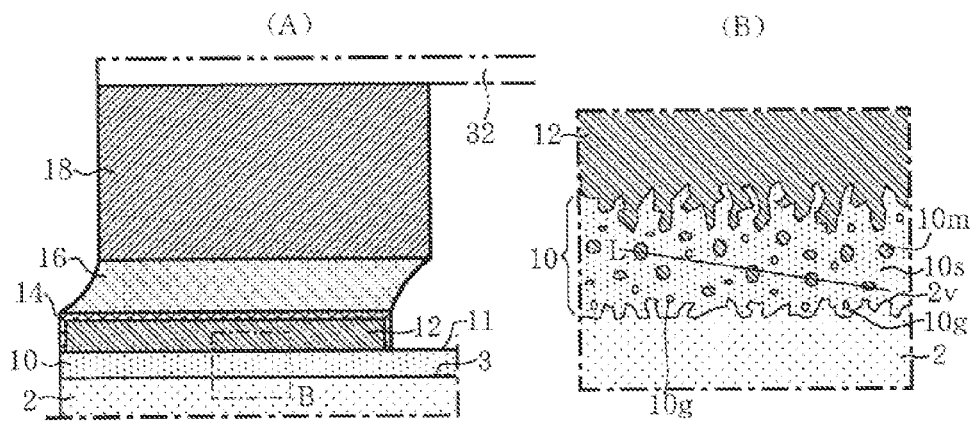
[FIG. 3] (A) is an enlarged sectional view of region A surrounded by the dot-dash line in FIG. 2, and (B) is a schematic enlarged sectional view of region B surrounded by the dot-dash line in (A).

FIG. 1 is a plan view showing a ceramic substrate 1 according to a mode for carrying out the present invention; FIG. 2 is a vertical sectional view taken along line X-X in FIG. 1; FIG. 3(A) is an enlarged sectional view of region A surrounded by the dot-dash line in FIG. 2; and FIG. 3(B) is a schematic enlarged sectional view of region B surrounded by the dot-dash line in FIG. 3(A).

As shown in FIGS. 1 and 2, the ceramic substrate 1 includes a substrate body 2 formed of alumina (ceramic) or the like and having a surface 3 and a back surface (surface) 4, each having a rectangular shape as viewed in plane; a composite material layer 10 formed on the entirety of the surface 3 of the substrate body 2; and a metallization layer 12 having the form of a rectangular frame as viewed in plane and disposed along a peripheral portion of an upper surface 11 of the composite material layer 10. The thickness of the metallization layer 12 is thicker than that of the composite material layer 10 and is formed of W, Mo, or an alloy which contains W or Mo as a main component. As shown in FIGS. 2 and 3(A), a metal frame 18 having the form of a rectangular frame as viewed in plane and a rectangular vertical section is joined onto the metallization layer 12 via a brazing material 16.

Furthermore, a pair of pads (electrodes) 9 which contains W or Mo as a main component is formed on a portion of the upper surface 11 of the composite material layer 10 surrounded by the metallization layer 12, and the pads 9 are connected to corresponding electrodes of an electronic component (not shown), such as a crystal vibrator, to be mounted later.

The pads 9 are connected to an unillustrated via conductor extending through the substrate body 2, and the via conductor is connected to back-surface electrodes (not shown) formed on the back surface 4 of the substrate body 2. The brazing material 16 is formed of, for example, an Ag brazing metal, and the metal frame 18 is formed of, for example, Kovar or 42Alloy.

As shown in FIG. 3(B), the composite material 10 is composed of a ceramic portion 10s formed of alumina and serving as a base (matrix), and a metal portion (metal powder) 10m formed of W or the like and a glass portion (glass particles) 10g which exist together in the ceramic portion 10s. An obscure boundary 2v is located between the ceramic portion 10s and alumina or the like of the substrate body 2. Meanwhile, the metallization layer 12 penetrates into the ceramic portion 10s in a dendroid or anchor-like fashion.

The composite material 10 contains the metal portion 10m in an amount of 3 vol % to 20 vol % and the ceramic portion 10s and the glass portion 10g as balance. Thus, since it is difficult for electric current to flow on the surface (upper surface 11) and in the interior of the composite material 10, when a plating layer 14, which will be described next, is deposited by electroplating, a plating layer having such a magnitude as to allow flow of electricity is not deposited on the surface of the composite material 10.

Vol % (volume fraction) of the metal portion 10m is defined as follows: as shown in FIG. 3(B), a line segment (L) having an arbitrary length is drawn in the composite material 10; intersecting lengths of the metal portions 10m intersecting with the line segment (L) are totaled, and the ratio of the total length to the length of the line segment (L) is calculated; and this operation is performed at 30 arbitrary locations, and the average of the thus-obtained 30 ratios is taken as vol % of the metal portion 10m.

Ceramic of the substrate body 2 has a thermal expansion coefficient of about $7.5 \times 10^{-6}/°$ C.; the metallization layer 12 has a thermal expansion coefficient of about $5.3 \times 10^{-6}/°$ C.; and the composite material layer 10 has a thermal expansion coefficient of about $6.4 \times 10^{-6}/°$ C.

Table 1 shows the relationship between the volume fraction of the metal portion 10m in the composite material layer 10 and the degree of deposition of a plating layer to be deposited on the surface of the composite material layer 10 when electroplating is performed.

As shown in Table 1, at a volume fraction of the metal portion 10m of 50 vol % to 40 vol %, the plating layer was widely deposited on the surface of the composite material layer 10; however, at 20 vol %, the plating layer was locally deposited in a very small amount on the surface of the composite material layer 10, but the amount was not such a magnitude as to allow flow of electricity; and at 10 vol % or less, no plating layer was deposited.

TABLE 1

|  | Metal portion (vol %) | | | | | | |
| --- | --- | --- | --- | --- | --- | --- | --- |
|  | 50 | 40 | 30 | 20 | 10 | 3 | 0 |
| Adhesion of plating layer | FF | FF | FF | BB | AA | AA | AA |

Note:
FF deposition
BB slight deposition
AA no deposition

The relationship between the volume fraction and the electric resistance of the metal portion 10m in the composite material layer 10 was examined under the same conditions by use of a tester. As a result, at a volume fraction of the metal portion 10m of 50 vol % to 30 vol %, resistance was 2 $\Omega$/cm to 3 $\Omega$/cm; at a volume fraction of the metal portion 10m of 20 vol %, resistance was 12 $\Omega$/cm to 13 $\Omega$/cm; and at a volume fraction of the metal portion 10m of 10 vol % or less, resistance was $1.0 \times 10^{12}$ $\Omega$/cm to $1.2 \times 10^{12}$ $\Omega$/cm, thereby backing the tendency of the degree of deposition of the plating layer in Table 1.

The above results have revealed the necessity of employing a metal portion 10m content of 3 vol % to 20 vol % in order to prevent unintended deposition of the plating layer on the surface of the composite material layer 10.

Also, as shown in FIG. 3(A), the surface (upper surface and inner and outer side surfaces) of the metallization layer 12 is coated with the plating layer 14 formed of an Ni plating film. The plating layer 14 may assume a two-layered form in which the upper surface of the Ni plating film is coated with an Au plating film.

Furthermore, in order to seal an electronic component from the external environment after the electronic component is mounted on the pair of pads 9, as shown in FIG. 3(A), a peripheral portion of a lid plate 32 having a rectangular shape as viewed in plane and having an external form substantially analogous to that of the metal frame 18 is joined to the upper surface of the metal frame 18 by seam welding. The lid plate 32 is formed of, for example, Kovar (metal) and is seam-welded to the upper surface of the metal frame 18 by rolling a pair of roller-shaped electrodes (not shown) on each pair of opposed sides.

The thus-configured ceramic substrate 1 has the composite material layer 10 composed of the ceramic portion 10s, the metal portion 10m, and the glass portion 10g and formed on the entirety of the surface 3 of the substrate body 2 formed of alumina or the like, and the metallization layer 12 formed on the upper surface 11 of the composite material layer 10 in such a manner as to be thicker than the composite material layer 10 and having the plating layer 14 formed on the surface thereof. As a result, even when the substrate body 2 having the composite material layer 10 and the metallization layer 12 is fired, deposition of a glass component contained in the composite material layer 10 on the surface of the metallization layer 12; i.e., so-called "glass surfacing," does not arise; therefore, a defect such as separation of plating can be prevented.

Accordingly, for example, even upon reception of post-heating shrinkage stress of the metal frame 18 and the lid plate 32 in brazing the metal frame 18 onto the metallization layer 12 via the brazing material 16 and in seam-welding the metal lid plate 32 onto the upper surface of the metal frame 18, the metallization layer 12 is unlikely to separate from ceramic of the substrate body 2.

Furthermore, since the composite material layer 10 is formed on the entirety of the surface 3 of the substrate body 2, in the course of manufacture, the metallization layer 12 is reliably provided on the upper surface 11 of the composite material layer 10; therefore, there can be reliably restrained separation of the metallization layer 12 from ceramic of the substrate body 2.

Therefore, an electronic component mounted on a portion of the upper surface 11 of the composite material layer 10 surrounded by the metallization layer 12 and the metal frame 18 can be reliably sealed from the external environment.

The ceramic substrate may assume a form such that the composite material layer 10, the metallization layer 12 having the plating layer 14 formed on its surface, the brazing material 16, and the metal frame 18 are also disposed on the back surface 4 of the flat-plate-like substrate body 2 in a symmetrical manner between the upper and lower sides.

Figure 4:
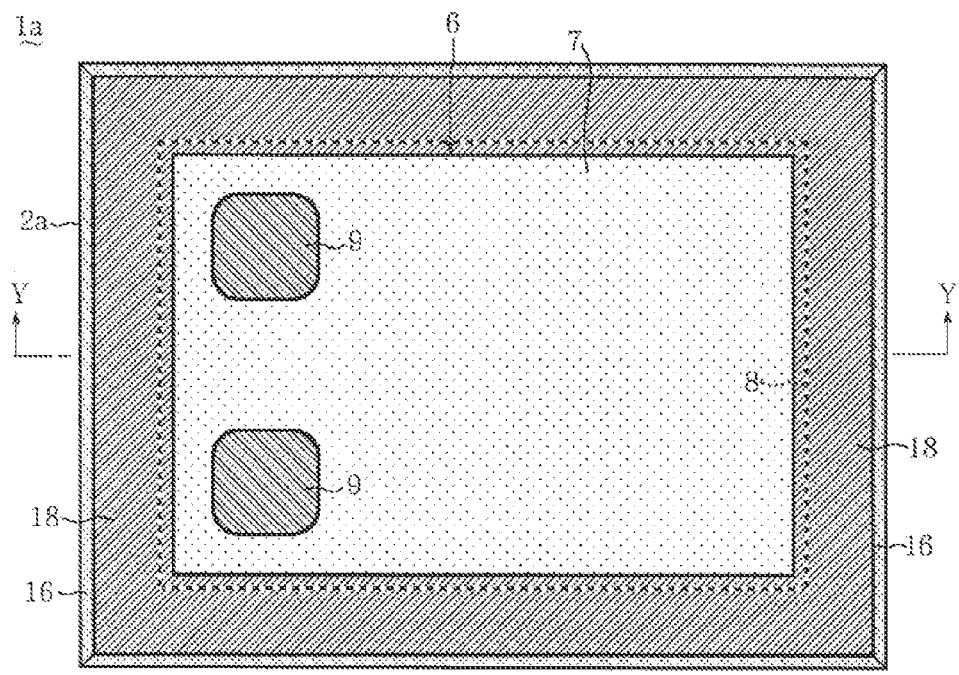
[FIG. 4] Plan view showing a ceramic substrate according to a different mode.
Figure 5:
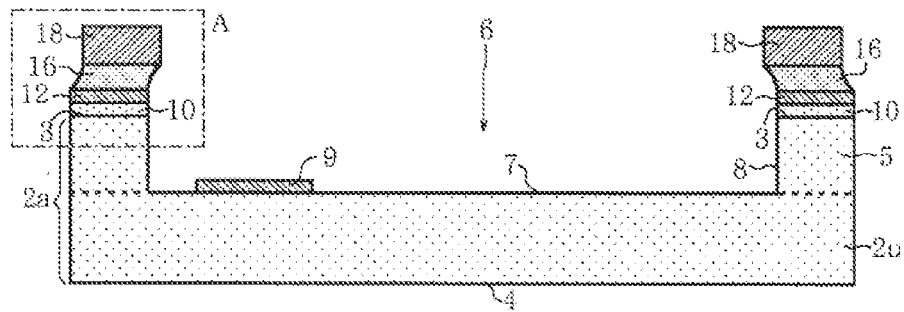
[FIG. 5] Vertical sectional view taken along line Y-Y in FIG. 4.

FIG. 4 is a plan view showing a ceramic substrate 1*a* according to a different mode for carrying out the present invention; FIG. 5 is a vertical sectional view taken along line Y-Y in FIG. 4; and FIG. 6 is an enlarged view of region A surrounded by the dot-dash line in FIG. 5.

Figure 6:
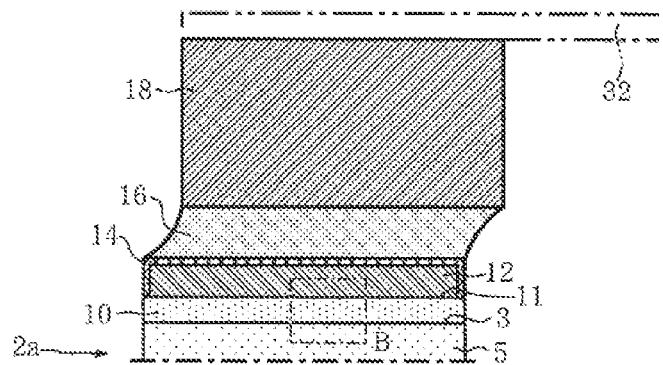
[FIG. 6] Enlarged sectional view of region A surrounded by the dot-dash line in FIG. 5.

As shown in FIGS. 4 to 6, the ceramic substrate 1*a* includes a box-like substrate body 2*a* formed of ceramic mentioned above and having the surface 3 and the back surface 4, each having a rectangular shape (external form) as viewed in plane; the above-mentioned composite material layer 10 formed on the surface 3 having the form of a rectangular frame as viewed in plane of the substrate body 2*a* while having the same shape as that of the surface 3; and the above-mentioned metallization layer 12 disposed on the entirety of the upper surface 11 of the composite material layer 10. As shown in FIG. 5, the substrate body 2*a* is a laminate of a flat-plate-like lower ceramic layer 2*u* and an upper ceramic layer 5 having the form of a rectangular frame as viewed in plane, and the cavity 6 having a rectangular shape as viewed in plane opens at a central portion of the substrate body 2*a*.

As shown in FIGS. 4 and 5, the cavity 6 is defined by a bottom surface 7 having a rectangular shape as viewed in plane and four side surfaces 8 standing vertically toward the surface 3 from four sides of the bottom surface 7, and a pair of the pads 9 mentioned above is formed on the bottom surface 7.

Furthermore, as shown in FIGS. 5 and 6, the metal frame 18 mentioned above is joined, via the brazing material 16 mentioned above, onto the metallization layer 12 having the above-mentioned plating layer 14 deposited on its surface. After an electronic component is mounted within the cavity 6 while being connected to the pair of pads 9, the lid plate 32 mentioned above is seam-welded onto the upper surface of the metal frame 18, thereby sealing the cavity 6 including the electronic component.

Region B surrounded by the dot-dash line in FIG. 6 corresponds to FIG. 3(B) and shows the composite material layer 10 mentioned above and composed of the ceramic portion 10*s*, the metal portion 10*m*, and the glass portion 10*g*.

Although the cavity 6 opens at the rectangular-frame-shaped surface 3 of the substrate body 2*a*, since the composite material layer 10 including the plating layer 14 on its surface is formed on the surface 3, the ceramic substrate 1*a* configured as described above can also yield effects similar to those mentioned above. When the metal frame 18 is brazed, via the brazing material 16, onto the metallization layer 12 disposed on the upper surface 11 of the composite material layer 10 and when the metal lid plate 32 is seam-welded onto the upper surface of the metal frame 18, there can be prevented separation of an outer peripheral portion of the metallization layer 12 from ceramic of the substrate body 2*a* which could otherwise result from post-heating shrinkage stress.

Furthermore, as will be mentioned in the later description of a second ceramic substrate manufacturing method, after the composite material layer 10 and the metallization 12 are formed on the entirety of the surface of a ceramic green sheet which is to become the upper ceramic layer 5, a through-hole for forming the cavity 6 is punched in the ceramic green sheet at a central portion; therefore, no positional misalignment arises between the composite material layer 10 and the metallization 12.

The following form may also be employed: another rectangular-frame-shaped ceramic layer 5 is laminated on the back surface 4 of the flat-plate-like ceramic layer 2*u*; the composite material layer 10, the metallization layer 12 including the plating layer 14, the brazing material 16, and the metal frame 18 mentioned above are disposed on the rectangular-frame-like surface 3 of the ceramic layer 5 in a symmetrical manner between the upper and lower sides; and the cavity 6 is also provided.

A first ceramic substrate manufacturing method for yielding the ceramic substrate 1 will next be described.

Figure 7:
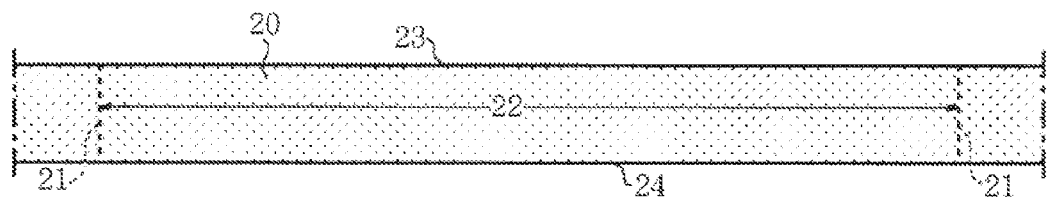
[FIG. 7] Schematic view showing one step in a first manufacturing method for manufacturing the ceramic substrate.

Alumina powder, a binder resin, a solvent, etc., were mixed beforehand in respectively predetermined amounts for preparing a ceramic slurry. The ceramic slurry was formed into a sheet by a doctor blading process, thereby yielding a multi-product ceramic green sheet (hereinafter, referred to merely as green sheet) 20 as shown in FIG. 7. As shown in FIG. 7, the green sheet 20 has a front surface 23 and a back surface 24 and is composed of a product region where a plurality of substrate regions 22 which are divided by imaginary boundary planes 21 arranged in lattice as viewed in plane and are to become the substrate bodies 2 are juxtaposed adjacently in rows and columns as viewed in plane, and an edge portion (not shown) having the form of a rectangular frame as viewed in plane and surrounding the outer periphery of the product region.

Figure 8:
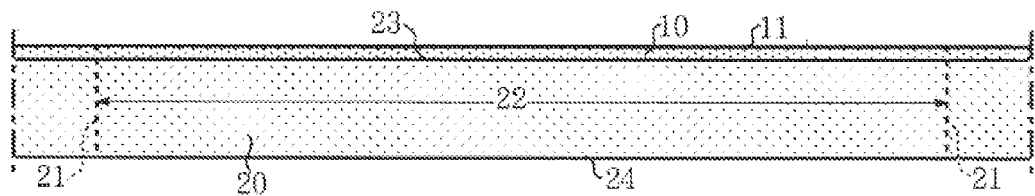
[FIG. 8] Schematic view showing a manufacturing step subsequent to the step of FIG. 7.

First, as shown in FIG. 8, a pasty composite material 10 composed of the ceramic portion 10*s*, the metal portion 10*m*, and the glass portion 10*g* and containing the metal portion 10*m* in an amount of 20 vol % or less was formed on the entirety of the front surface 23 of the green sheet 20 by screen printing (not shown). In this condition, in each of the substrate regions 22, a relatively-small-diameter through-hole (not shown) was formed at a predetermined position, and the through-hole was filled with an electrically conductive paste containing W powder or Mo powder, thereby forming a via conductor (not shown).

Figure 9:
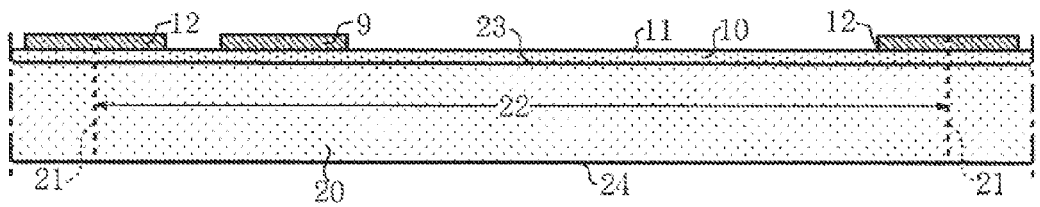
[FIG. 9] Schematic view showing a manufacturing step subsequent to the step of FIG. 8.

Next, as shown in FIG. 9, a pasty metallization layer 12 containing W powder (or Mo powder) was formed, by screen printing, on the upper surface 11 of the composite material 10 along four sides of each of the substrate regions 22 in such a manner as to form a lattice pattern as viewed in plane and in such a manner as to be thicker in thickness than the composite material layer 10. At the same time, a pair of pasty pads 9 was formed on the upper surface 11 on a side toward a central portion of each of the substrate regions 22.

In each of the substrate regions 22 on the back surface 24 of the green sheet 20, a plurality of back-surface electrodes (not shown) connected to the metallization layer 12 and the pads 9 via the via conductor were formed through application of the electrically conductive paste mentioned above by screen printing.

Figure 10:
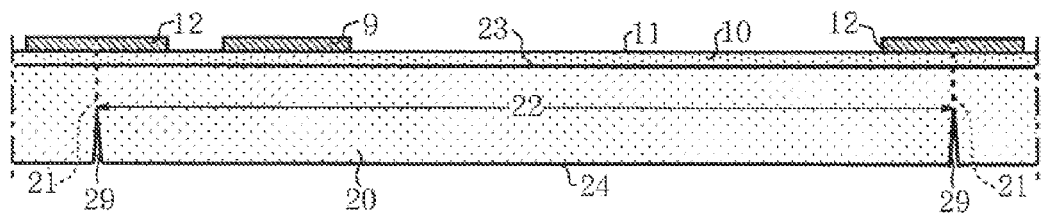
[FIG. 10] Schematic view showing a manufacturing step subsequent to the step of FIG. 9.

Next, as shown in FIG. 10, a knife (not shown) was applied into the back surface 24 of the green sheet 20 along the boundary planes 21 in the thickness direction, thereby forming dividing grooves 29, each having substantially reverse-V-shaped section, in lattice arrangement as viewed in plane.

Figure 11:
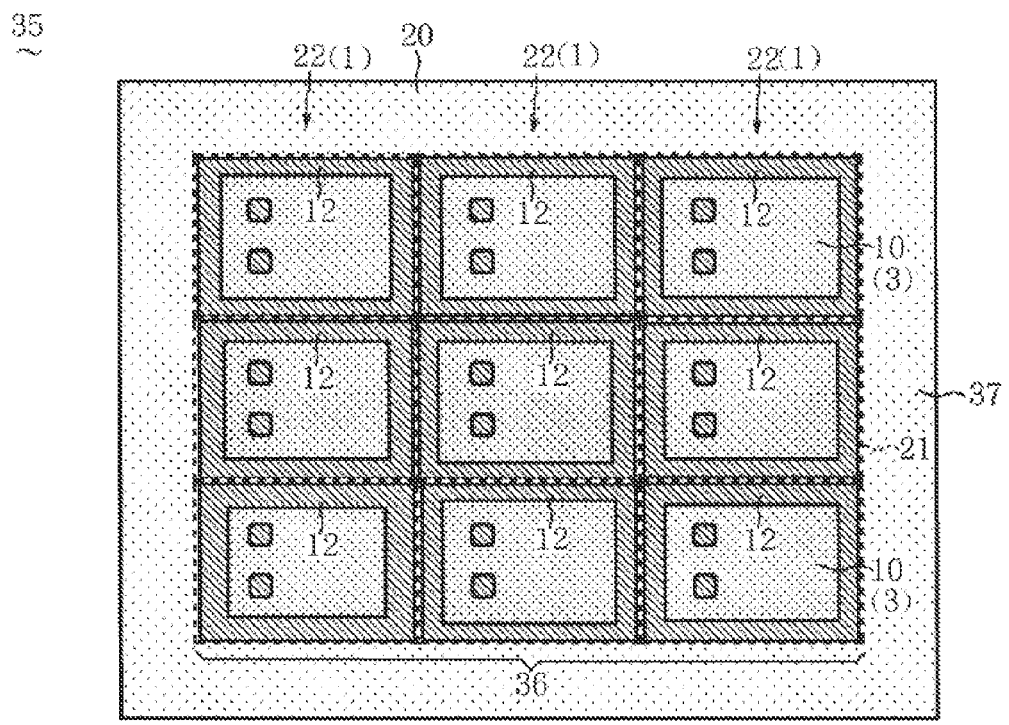
[FIG. 11] Schematic plan view showing a multi-product aggregation in the condition shown in FIG. 10.

FIG. 11 is a plan view of the green sheet 20 in the condition shown in FIG. 10, showing a multi-product ceramic substrate aggregate 35 composed of a product region 36 where a plurality of the substrate regions 22 which are to become the ceramic substrates 1 are juxtaposed adjacently in rows and columns, and an edge portion 37 having the form of a rectangular frame and located around the outer periphery of the product region 36.

Furthermore, the green sheet 20 having the composite material 10, the metallization layer 12, the dividing grooves 29, etc., formed thereon was co-fired together with the metallization layer 12, etc. As a result, the green sheet 20 became a ceramic layer 20. At this time, deposition of a glass component contained in the composite material layer 10 on the surface of the metallization layer 12 (so-called glass surfacing) did not arise.

Next, in a condition in which electrode rods (not shown) were in contact with corresponding plating electrodes (not shown) exposed within through-holes formed beforehand in the edge portion 37 of the ceramic layer 20, the ceramic layer 20 was immersed in an electroplating bath for Ni electroplating. As a result, the plating layer 14 (not shown) mentioned above was deposited on the surfaces (exposed surfaces) of the metallization layer 12, the pair of pads 9, and the back-surface electrodes which have being fired in each of the substrate regions 22. At this time, almost no plating layer 14 was deposited on an exposed portion of the upper surface 11 of the composite material 10. Also, almost no plating layer 14 was deposited on a portion of the upper surface 11 of the composite material layer 10 formed on the edge portion 37 of the ceramic layer 20.

Figure 12:
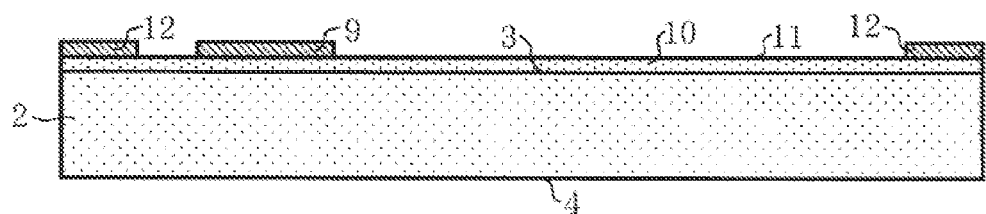
[FIG. 12] Schematic view showing a manufacturing step subsequent to the step of FIGS. 10 and 11.

Furthermore, the ceramic layer 20 which had undergone the plating process mentioned above was subjected to a shearing process along the dividing grooves 29. As a result, there were yielded a plurality of the substrate bodies 2 each having, as shown in FIG. 12, the composite material layer 10 formed on the entirety of the surface 3, the metallization layer 12 located along a peripheral portion of the upper surface 11 of the composite material layer 10, and a pair of the pads 9 located on a portion of the upper surface 11 surrounded by the metallization layer 12 on a side toward a central portion of the upper surface 11.

Figure 13:
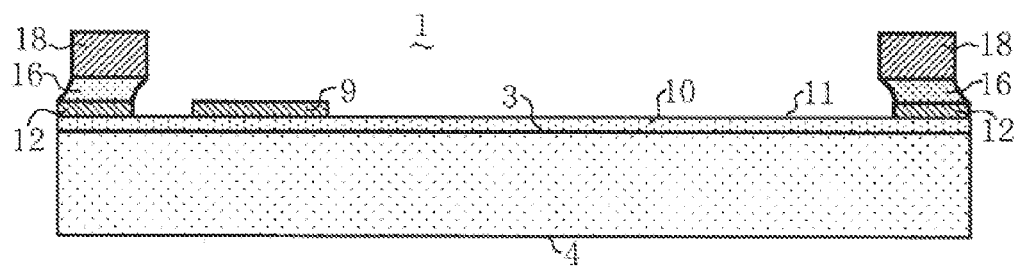
[FIG. 13] Schematic view showing the ceramic substrate according to the one mode yielded through the above steps.

Finally, as shown in FIG. 13, the metal frame 18 was brazed, via the brazing material 16, onto the metallization layer 12 in each of the substrate bodies 2 each having the surface 3 and the back surface 4, whereby a plurality of the ceramic substrates 1 were yielded.

In the embodiment described above, after the ceramic layer 20 is subjected to a shearing process, the metal frame 18 is brazed; however, the order of these steps may be reversed.

Also, after the metal frame 18 is brazed onto the metallization layer 12, Ni plating and Au plating may be sequentially deposited further on the surfaces (exposed surfaces) of the metallization layer 12, the brazing material 16, and the metal frame 18.

According to the above-described first manufacturing method for yielding the ceramic substrate 1, the composite material layer 10 is formed on the entirety of the front surface 23 of the green sheet 20; the metallization layer 12 having the form of a rectangular frame is formed on the upper surface 11 of the composite material layer 10 in each of the substrate regions 22; and the plating layer 14 is deposited on the surface of the metallization layer 12. Therefore, separation of plating from the metallization layer 14 did not arise, and influence of printing misalignment of the metallization layer 12 was able to be restrained. Furthermore, another plating layer in such an amount as to allow flow of electricity was not unintendedly formed on an exposed portion of the upper surface 11 of the composite material layer 10 where the metallization layer 12 and the pads 9 were not formed.

Therefore, there were able to be provided reliably and efficiently a plurality of the ceramic substrates 1 each configured such that, when the metal frame 18 is brazed onto the metallization layer 12 and when the metal lid plate 32 is seam-welded onto the upper surface of the metal frame 18, in spite of post-heating generation of shrinkage stress, the metallization layer 12 is unlikely to separate from ceramic of the substrate body 2. Furthermore, since almost no plating layer 14 was deposited on the upper surface 11 of the composite material layer 10, the ceramic substrates 1 were able to be manufactured at low cost.

Meanwhile, the following form may be employed: the green sheet 20 assumes the form of a laminate of two layers; i.e., an upper green sheet and a lower green sheet; a wiring layer in a predetermined pattern is formed therebetween; and the wiring layer can electrically communicate with the plating electrodes of the edge portion.

Next, a second ceramic substrate manufacturing method for yielding the ceramic substrate 1a will be described.

An upper green sheet 25 shown in FIG. 14 and a lower green sheet 28 to be described later were manufactured by a method similar to that mentioned above.

Figure 14:
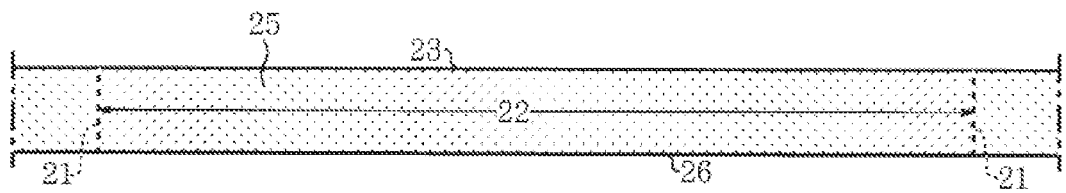
[FIG. 14] Schematic view showing one step in a second manufacturing method for manufacturing the ceramic substrate.

As shown in FIG. 14, the green sheet 25 has the front surface 23 and a back surface 26 and is composed of a product region where a plurality of the substrate regions 22 which are divided by the imaginary boundary planes 21 arranged in lattice as viewed in plane and are to become the substrate bodies 2 are juxtaposed adjacently in rows and columns as viewed in plane, and a edge portion (not shown) surrounding the outer periphery of the product region.

Figure 15:
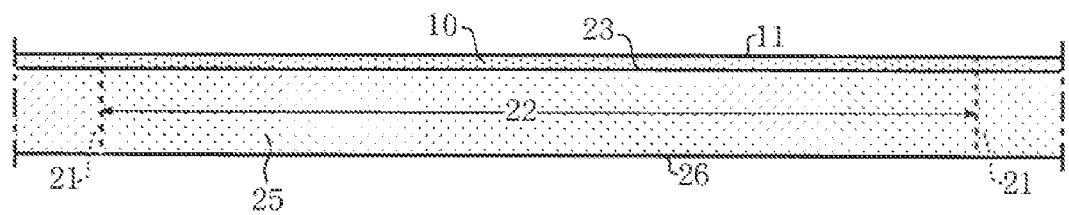
[FIG. 15] Schematic view showing a manufacturing step subsequent to the step of FIG. 14.

First, as shown in FIG. 15, the composite material 10 mentioned above was formed on the entirety of the front surface 23 of the green sheet 25 in a manner similar to that mentioned above. In this condition, in each of the substrate regions 22, a through-hole was formed at a predetermined position located toward the periphery, and a via conductor (not shown) was formed on the inside of the through-hole.

Figure 16:
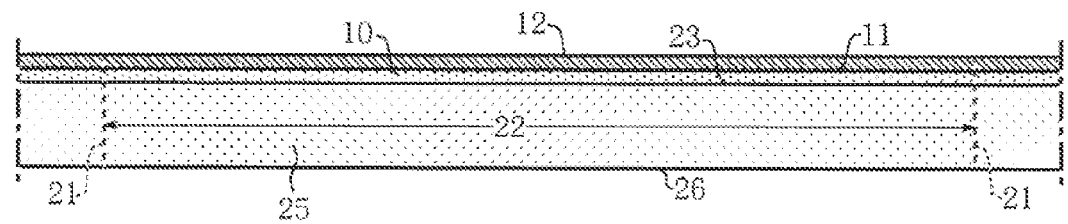
[FIG. 16] Schematic view showing a manufacturing step subsequent to the step of FIG. 15.

Next, as shown in FIG. 16, the metallization layer 12 mentioned above and having a thickness thicker than that of the composite material layer 10 was formed on the entirety of the upper surface 11 of the composite material 10 by the method mentioned above. At this time, the metallization layer 12 was connected to the via conductor.

Figure 17:
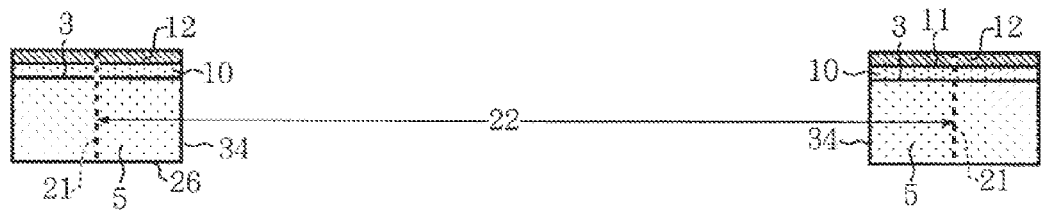
[FIG. 17] Schematic view showing a manufacturing step subsequent to the step of FIG. 16.

Next, by use of a punch having a rectangular shape as viewed in plane and a die, a punching process was performed on a central portion of each of the substrate regions 22 of the upper green sheet 25. As a result, as shown in FIG. 17, a through-hole 34 having a rectangular shape as viewed in plane and extending through the upper green sheet 25 between the front surface 23 and the back surface 26 was formed at a central portion of each of the substrate regions 22, thereby yielding a green sheet 5 having the form of lattice as viewed in plane.

Figure 18:
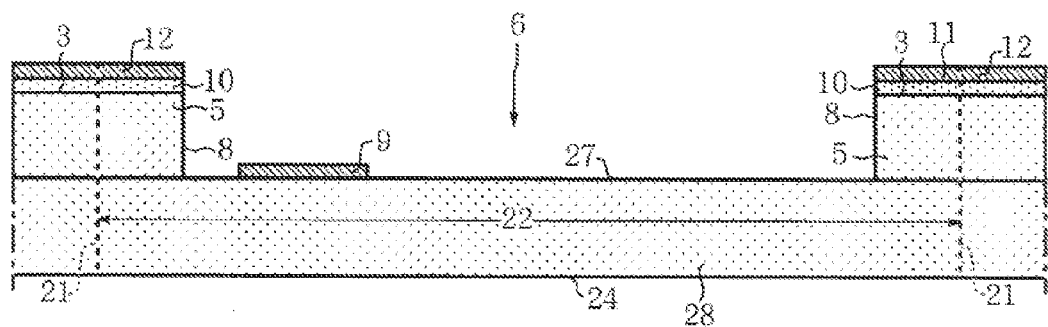
[FIG. 18] Schematic view showing a manufacturing step subsequent to the step of FIG. 17.

Furthermore, as shown in FIG. 18, the flat-plate-like lower green sheet 28 having a front surface 27 and the back surface 24 and having pasty pads 9 formed beforehand on the front surface 27 at predetermined positions was laminated on the back surface 26 of the upper green sheet 5 such that the corresponding boundary planes 21 of the upper and lower green sheets 5 and 28 align with each other, thereby closing the through-holes 34 from the bottom side. As a result, the cavities 6 each being defined by a portion of the front surface 27; i.e., a bottom surface 27, and four side surfaces 8 were formed above the green sheet 28 and inside the green sheet 5.

Back-surface electrodes (not shown) were formed beforehand on the back surface 24 of the lower green sheet 28 in each of the substrate regions 22, and the back-surface electrodes were connected to the pads 9 via a via conductor (not shown) extending through the green sheet 28 and connected, via another via conductor (not shown), to the aforementioned via conductor (not shown) provided in the upper green sheet 25. That is, electrical communication was established between the metallization layer 12 and the pads 9 via the back-surface electrodes and the via conductors.

Figure 19:
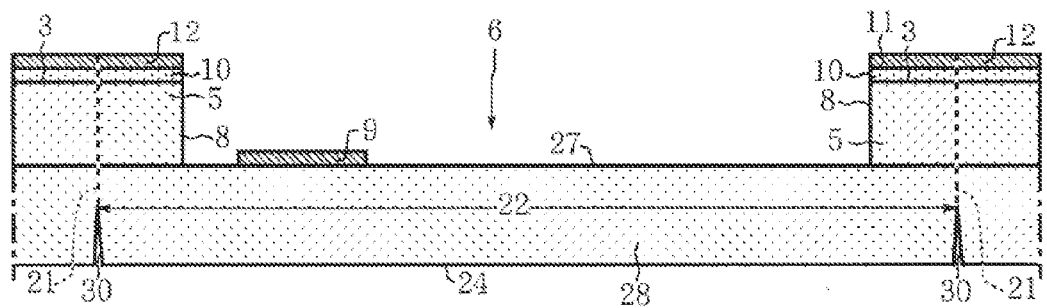
[FIG. 19] Schematic view showing a manufacturing step subsequent to the step of FIG. 18.

Next, as shown in FIG. 19, a knife (not shown) was applied into the back surface 24 of the lower green sheet 28 along the boundary planes 21 in the thickness direction, thereby forming dividing grooves 30, each having substantially reverse-V-shaped section, in lattice arrangement as viewed in plane.

Figure 20:
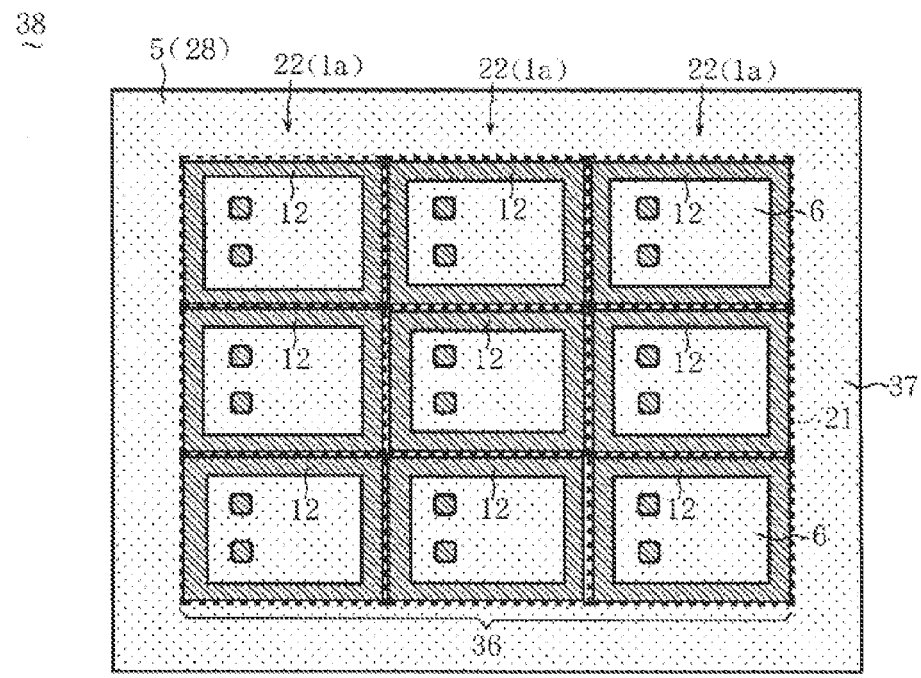
[FIG. 20] Schematic plan view showing a multi-product aggregation in the condition shown in FIG. 19.

FIG. 20 is a plan view of the green sheets 5 and 28 in the condition shown in FIG. 19, showing a multi-product ceramic substrate aggregate 38 composed of the product region 36 where a plurality of the substrate regions 22 which are to become the ceramic substrates 1a are juxtaposed adjacently in rows and columns, and the edge portion 37 having the form of a rectangular frame and located around the outer periphery of the product region 36.

Next, the laminate of the green sheets 5 and 28 having the composite material 10, the metallization layer 12, the dividing grooves 30, etc., formed thereon was co-fired together with the metallization layer 12, etc.

As a result, the green sheets 5 and 28 became a multilayer structure of ceramic layers 5 and 28. After the firing, deposition of a glass component contained in the composite material layer 10 on the surface of the metallization layer 12 (so-called glass surfacing) did not arise.

Furthermore, in a condition in which electrode rods (not shown) were inserted into and in contact with the aforementioned corresponding plating electrodes exposed within through-holes formed beforehand in the edge portion 37 of the multilayer structure of ceramic layers 5 and 28, the multilayer structure of ceramic layers 5 and 28 was immersed in an electroplating bath for Ni electroplating. As a result, the plating layer 14 (not shown) mentioned above was deposited on the surfaces (exposed surfaces) of the metallization layer 12 which has being fired in each of the substrate regions 22, the pair of pads 9 within the cavity 6, and the back-surface electrodes. At this time, no plating layer 14 was deposited on the exposed opposite side surfaces of the composite material layer 10.

Figure 21:
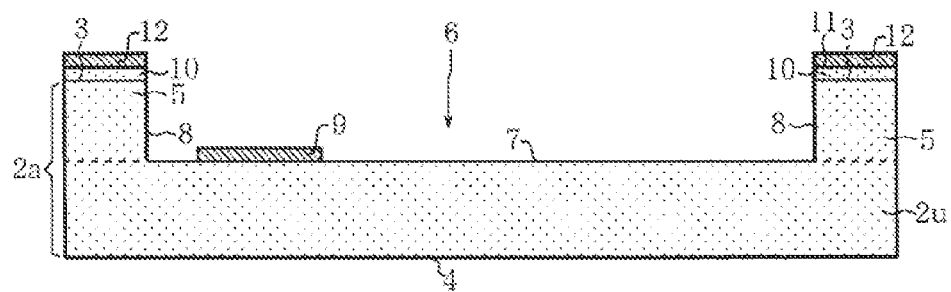
[FIG. 21] Schematic view showing a manufacturing step subsequent to the step of FIGS. 19 and 20.

Then, the multilayer structure of ceramic layers 5 and 28 which had undergone the plating process mentioned above was subjected to a shearing process along the dividing grooves 30. As a result, there were yielded a plurality of the substrate bodies 2a each having, as shown in FIG. 21, the surface 3 and the back surface 4 and having the composite material layer 10 formed on the entirety of the surface 3 in the form of a rectangular frame, the metallization layer 12 located on the entirety of the upper surface 11 of the composite material layer 10, and the pair of pads 9 located on the bottom surface 7 of the cavity 6.

Figure 22:
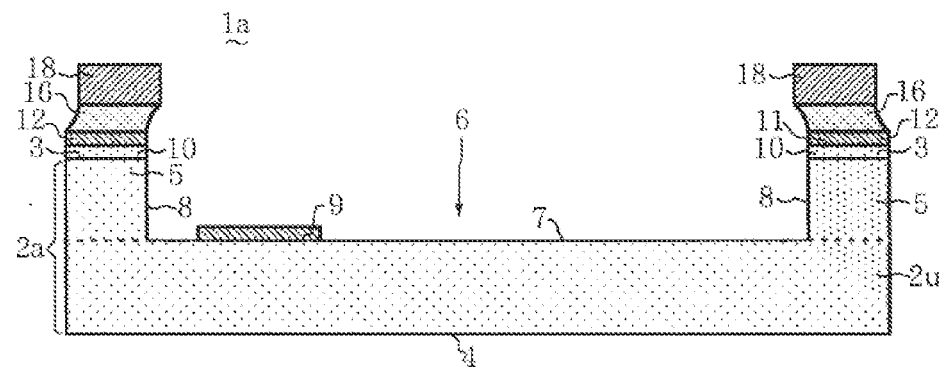
[FIG. 22] Schematic view showing the ceramic substrate according to a different mode yielded through the above steps.

Finally, as shown in FIG. 22, the metal frame 18 was brazed, via the brazing material 16, onto the metallization layer 12 in each of the substrate bodies 2a each having the surface 3 and the back surface 4, whereby a plurality of the ceramic substrates 1a were yielded.

According to the above-described second manufacturing method for yielding the ceramic substrate 1a, since the composite material layer 10 and the metallization layer 12 thicker than the composite material layer 10 were able to be sequentially formed on the entirety of the front surface 23 of the upper ceramic green sheet 25, in addition to the effects mentioned above, positional misalignment did not arise between the composite material layer 10 and the metallization layer 12 which had the form of a rectangular frame as viewed in plane as a result of a central portion of the green sheet 25 being punched out along the thickness direction. Thus, the required plating layer 14 was able to be reliably deposited on the surface of the metallization layer 12, and an unintended plating layer allowing flow of electricity was able to be prevented from depositing on externally exposed opposite side surfaces of the composite material layer 10.

Therefore, by means of laminating the upper and lower green sheets 5 and 28 together, followed by firing, there were able to be reliably manufactured a plurality of the ceramic substrates 1a in each of which the composite material layer 10 and the metallization layer 12 were disposed in two layers on the entirety of the surface 3 having the form of a rectangular frame as viewed in plane of the substrate body 2a having the cavity 6 opening at its central portion.

Figure 23:
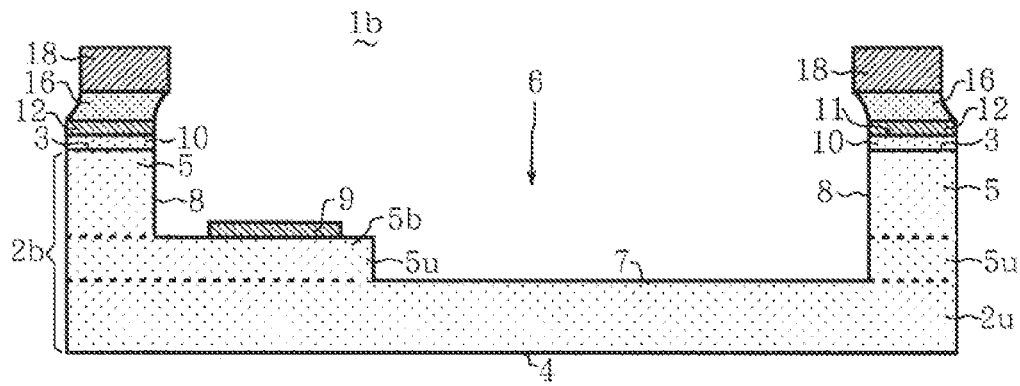
[FIG. 23] Schematic view showing an applied mode of the ceramic substrate shown in FIGS. 4 to 6 and 20.

FIG. 23 is a vertical sectional view showing a ceramic substrate 1b according to an applied mode of the ceramic substrate 1a.

As shown in FIG. 23, the ceramic substrate 1b includes a box-like substrate body 2b formed of ceramic mentioned above and having the surface 3 and the back surface 4, each having a rectangular shape (external form) as viewed in plane; the above-mentioned composite material layer 10 formed on the entirety of the surface 3 having the form of a rectangular frame as viewed in plane of the substrate body 2b; and the above-mentioned metallization layer 12 disposed on the entirety of the upper surface 11 of the composite material layer 10 and having a thickness thicker than that of the composite material layer 10. The plating layer 14 mentioned above is deposited on the surface of the metallization layer 12. The metal frame 18 is joined onto the metallization layer 12 via the brazing material 16 in a manner similar to that mentioned above.

As shown in FIG. 23, the substrate body 2b is a laminate of a flat-plate-like lower ceramic layer 2u, an intermediate layer 5u having the form of a rectangular frame as viewed in plane, and an upper ceramic layer 5 having the form of a rectangular frame as viewed in plane. The cavity 6 having a rectangular shape as viewed in plane opens at a central portion of the substrate body 2b, and the cavity 6 is defined by the bottom surface 7 which is a portion of the surface of the ceramic layer 2u, and four side surfaces 8 of the ceramic layers 5u and 5.

As shown at the left of FIG. 23, the relatively thin intermediate ceramic layer 5u has a pair of stepped portions 5b each having the form of a flat plate and disposed in the near-side-far-side direction in the drawing. The pads 9 mentioned above are formed on the stepped portions 5b, respectively.

The thus-configured ceramic substrate 1b yields effects similar to those yielded by the ceramic substrates 1 and 1a and facilitates mounting of a crystal vibrator which vibrates along the vertical direction. The ceramic substrate 1b can be manufactured by the second manufacturing method as in the case of manufacture of the ceramic substrate 1a.

Figure 24:
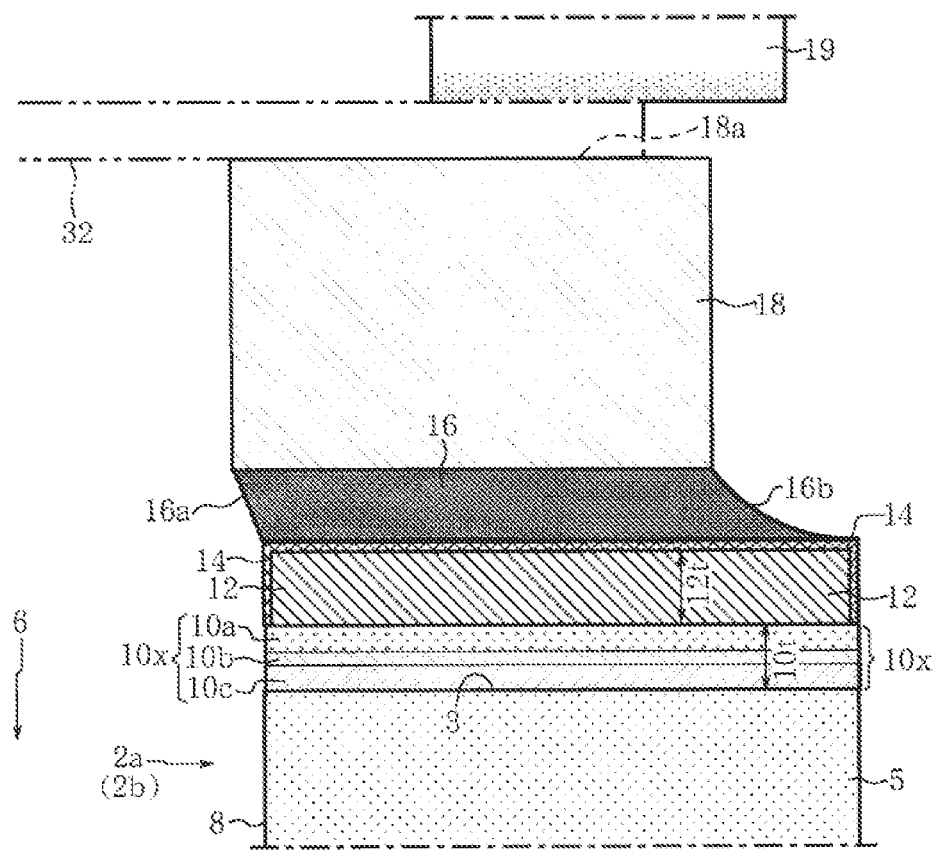
[FIG. 24] Enlarged sectional view showing the composite material layer in a different form.

FIG. 24 is a sectional view similar to FIG. 2, inclusively showing a composite material layer 10x in a different form.

As shown in FIG. 24, the composite material layer 10x is composed of three layers; specifically, a first partial composite material layer 10a adjacently located immediately under the metallization layer 12, a third partial composite material layer 10c located on a side toward the surface 3 of the substrate body 2a (2b), and a second partial composite material layer 10b sandwiched between the first and third partial composite material layers 10a and 10c, and the surfaces thereof are coated with the plating layer 14 mentioned above.

The first to third partial composite material layers 10a to 10c are laminated such that their total thickness 10t is thinner than a thickness 12t of the metallization layer 12. For example, the mixing ratio is changed stepwise as follows: the first partial composite material layer 10a has a 30 vol %:70 vol % mixing ratio between the ceramic portion 10s and the balance of the metal portion 10m and the glass portion 10g; the second partial composite material layer 10b has a 50 vol %:50 vol % mixing ratio between the ceramic portion 10s and the balance of the metal portion 10m and the glass portion 10g; and the third partial composite material layer 10c has a 70 vol %:30 vol % mixing ratio between the ceramic portion 10s and the balance of the metal portion 10m and the glass portion 10g.

Through use of the composite material layer 10x composed of the first, second, and third partial composite material layers 10a to 10c, in addition to the effects mentioned above, when the metal lid 32 is seam-welded onto the metal frame 18 which is brazed onto the metallization layer 12 via the brazing material 16, by use of roller electrodes 19 which roll on a peripheral portion of the upper surface of the metal lid 32, there can be reliably mitigated stress resulting from thermal shrinkage during cooling after thermal expansion resulting from resistance heat generation. As a result, separation of the metallization layer 12 from the surface 3 of the substrate body 2 can be more reliably prevented, and accurate operation of an electronic component sealed in the cavity 6 can be ensured. The composite material layer 10x may assume a form in which any one or more of the first, second, and third partial composite material layers 10a, 10b, and 10c are laminated together.

Also, as shown in FIG. 24, the brazing material 16 has an inclined surface 16a along the inner periphery and a diagonally downwardly concaved surface 16b along the outer periphery.

Figure 25:
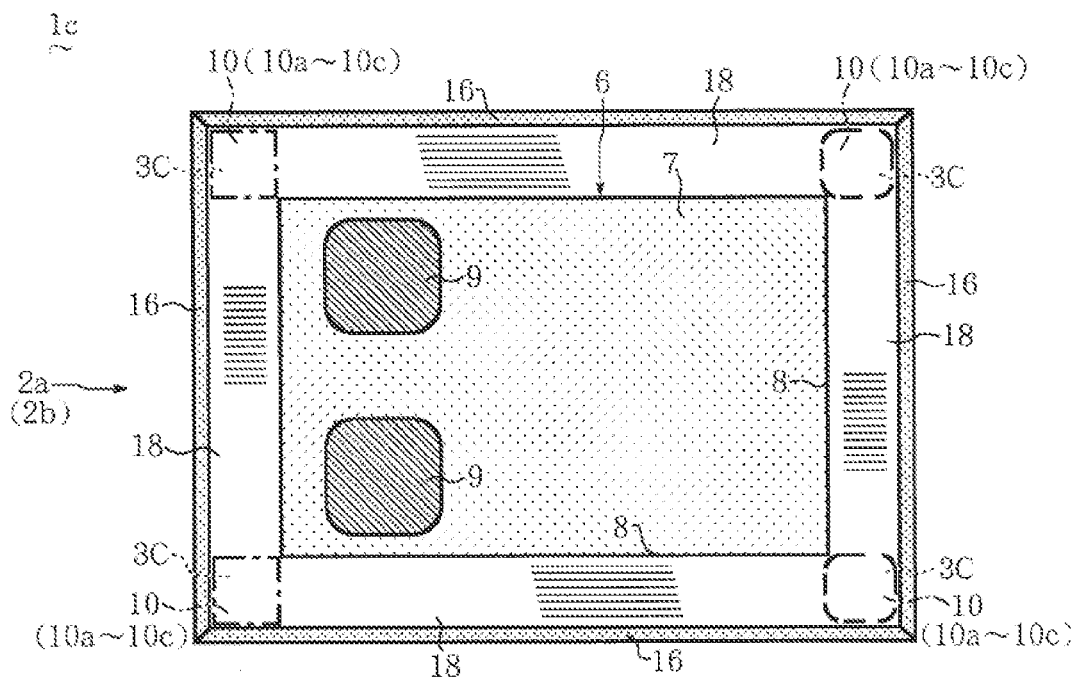
[FIG. 25] Plan view of a ceramic substrate, showing the composite material layer in a further different form.

FIG. 25 is a plan view showing a ceramic substrate 1c having the composite material layer 10 in a different form.

The ceramic substrate 1c includes the substrate body 2 similar to that of the ceramic substrate 1, the metallization layer 12 having the plating layer 14 deposited on its surface, the brazing material 16, and the metal frame 18, and has, as shown in FIG. 25, the composite material layer 10 formed on the surface 3 of the substrate body 2 merely at four corner portions 3C.

As mentioned above, a step of seam-welding a peripheral portion of the metal lid 32 onto the metal frame 18 is performed as follows: the ceramic substrate 1c and the metal lid 32 are clamped on an unillustrated table, a pair of electrode rollers 19 is rolled on the metal lid 32, for example, such that after first seam-welding is performed along a pair of long sides in parallel with each other, second seam-welding is performed along the remaining pair of short sides. At this time, the four corner portions 3C of the surface 3 of the substrate body 2 are influenced by stress resulting from thermal shrinkage associated with resistance heat generation caused by two times of seam welding along the long sides and the short sides; accordingly, portions of the metallization layer 12 located at the four corner portions 3C are highly likely to separate from the surface 3.

Thus, effects similar to those yielded by the ceramic package 1 can be yielded by means of the ceramic substrate 1c in which, as shown in FIG. 25, the composite material layer 10 is formed merely at the corner portions 3C of the surface 3 of the substrate 2 where the adjacent long and short sides intersect with each other as viewed in plane.

As represented by the corner portions 3C at the left of FIG. 25, the composite material layer 10 may have a substantially square (rectangular) shape as viewed in plane; alternatively, as represented by the corner portions 3C at the right of FIG. 25, the composite material layer 10 may have a substantially square shape having radiused or chamfered corners as viewed in plane. Also, the composite material layer 10 may assume a form in which the first, second, and third partial composite material layers 10a, 10b, and 10c are laminated in three layers or a form in which any two of the partial composite layers 10a, 10b, and 10c are laminated together.

EXAMPLES

Specific examples of the ceramic substrate 1 according to the present invention will next be described.

Ten substrate bodies 2 of Comparative Example were prepared as follows: the metallization layer 12 having a thickness of about 12 μm was formed on the surface of the substrate body 2 which contained alumina as a main component, and the Ni plating layer 14 was deposited on the surface of the metallization layer 10.

The composite material layer 10 having a thickness of about 10 μm and the metallization layer 12 having a thickness of about 12 μm were sequentially laminated on the surfaces 3 of ten substrate bodies 2 which had the same size as that of Comparative Example and contained the same main component as that of Comparative Example; i.e., alumina, and the Ni plating layer 14 was deposited on the surfaces of the metallization layers 10, thereby yielding ten substrate bodies 2 of Example. The composite material layer 10 of Example contained alumina particles (ceramic portion) 10s, W powder (metal portion) 10m, and a glass portion (glass particles) 10g in the volume ratio 45:50:5.

Meanwhile, the Ag brazing metal pieces 16 having the same composition and the same dimensions and the metal frames 18 formed of the same Kovar and having the same dimensions were joined, by brazing or the like, onto the respective metallization layers 12 of the substrate bodies 2 of Comparative Example and onto the respective metallization layers 12 of the substrate bodies 2 of Example.

Furthermore, the metal lids 32 formed of the same Kovar and having the same dimensions were placed on the respective metal frames 18 of the ceramic substrates (1) of Example and Comparative Example prepared above. The ceramic substrates (1) were sequentially clamped on a table. Subsequently, the aforementioned pair of roller electrodes 19 were rolled on the individual metal lids 32 along two parallel sides, whereby seam welding was performed twice; i.e., in the longitudinal and lateral directions, under the same welding conditions.

The ceramic substrates (1) of Example and Comparative Example were visually observed to see if the metallization layers 12 were separated even partially from the surfaces 3 of the substrate bodies 2. The results of the observation are shown in Table 2.

TABLE 2

|  | Separation of metallization layer/ total No. of measurements |
|---|---|
| Example (composite material layer provided) | 0/10 |
| Comparative Example (composite material layer not provided) | 3/10 |

As shown in Table 2, all of ten ceramic substrates 1 of Example were free of separation of the metallization layer 12. By contrast, three of the ten ceramic substrates of Comparative Example showed separation of the metallization layer 12.

Conceivably, these results eventuated for the following reason: in Example, the composite material layer 10 which contained alumina particles (ceramic portion) 10s, W powder (metal portion) 10m, and glass particles (glass portion) 10g in the volume ratio 45:50:5 was formed between the metallization layer 12 and the surface 3 of the substrate body 2 while having a thickness thicker than the metallization layer 12; therefore, the plating layer 14 formed on the surface of the metallization layer 12 was free of plating separation or a like defect which could otherwise result from glass surfacing; as a result, stress caused by resistance heat generated in seam-welding the metal lid 32 was mitigated.

By contrast, conceivably, in the three ceramic substrates of Comparative Example, the above-mentioned stress caused the metallization layer 12 to separate from the surface 3 of the substrate body 2 because of lack of the composite material layer 10. Thus, Example mentioned above has backed superiority of the present invention.

Next, specific examples of the ceramic substrate 1 according to the present invention will next be described.

Substrate bodies 2 of Example and Comparative Example were manufactured in a total of 90 pieces as follows: the composite material layers 10 each having a thickness of about 10 μm were laminated on the entire surfaces 3 of the substrate bodies 2, respectively, which contained alumina as a main component; the metallization layers 12 having a thickness of about 13 μm and the same width were laminated on the composite material layers 10, respectively, along four sides of the composite material layers 10; the Ni plating films (plating layers) 14 having the same thickness were deposited on the surfaces of the metallization layers 12, respectively.

As shown in Table 3, as for the composition of the composite material layers 10, the volume percentage (vol %) of W powder (metal portion) 10m to the balance of alumina particles (ceramic portion) 10s and glass component (glass portion) 10g was varied at nine stages in the range of 14 vol % to 85 vol %, and ten ceramic substrates 1 were prepared for each of the nine stages.

Next, the metal frames 18 formed of the same Kovar and having the same dimensions were joined by brazing onto the upper surfaces of the metallization layers 12, respectively, via Ag brazing metal pieces (brazing materials) 16 having the same composition and the same dimensions.

Furthermore, the metal lids 32 formed of the same Kovar and having the same dimensions were placed on the respective metal frames 18 of the 90 ceramic substrates (1) of Example and Comparative Example prepared above. The ceramic substrates (1) were sequentially clamped on a table. Subsequently, the aforementioned pair of roller electrodes 19 were rolled on the individual metal lids 32 along two parallel sides, whereby seam welding was performed twice; i.e., in the longitudinal and lateral directions, under the same welding conditions.

TABLE 3

| | Percentage of metal portion (vol %) | | | | | | | | |
|---|---|---|---|---|---|---|---|---|---|
| | 85 | 80 | 68 | 55 | 36 | 29 | 20.5 | 20 | 14 |
| Tensile strength of metal frame (N) | 7.8 | 9.8 | 9.8 | 9.8 | 9.8 | 9.8 | 9.8 | 7.8 | 7.8 |
| Separation of metallization layer | Observed | No | No | No | No | No | No | Slightly observed | Observed |

The metal frames 18 of the ceramic substrates (1) of Example and Comparative Example were pulled in the same direction with the same force (N), thereby measuring tensile strengths when the metallization layers 12 and the composite material layers 10 were separated from the surfaces 3 of the substrate bodies 2. The average tensile strength of every ten ceramic substrates (1) of Example and Comparative Example were shown in Table 3. As a result, the ceramic substrates 1 of Example in which the metal portions 10m in the composite material layers 10 had a volume percentage of 80 vol % to 20.5 vol % exhibited a tensile strength of the metal frames 18 of 9.8 N. By contrast, the ceramic substrates 1 of Comparative Example in which the metal portions 10m had a volume percentage of 85 vol %, 20 vol %, and 14 vol % exhibited a tensile strength of 7.8 N lower than that of Example mentioned above.

Therefore, the following has been revealed: according to the ceramic substrates 1 of Example in which the metal portions 10m contained in the composite material layers 10 have a volume percentage greater than 20 vol % to 80 vol %, by virtue of the composite material layers 10, the metallization layers 12 have sufficient strength.

Figure 26:
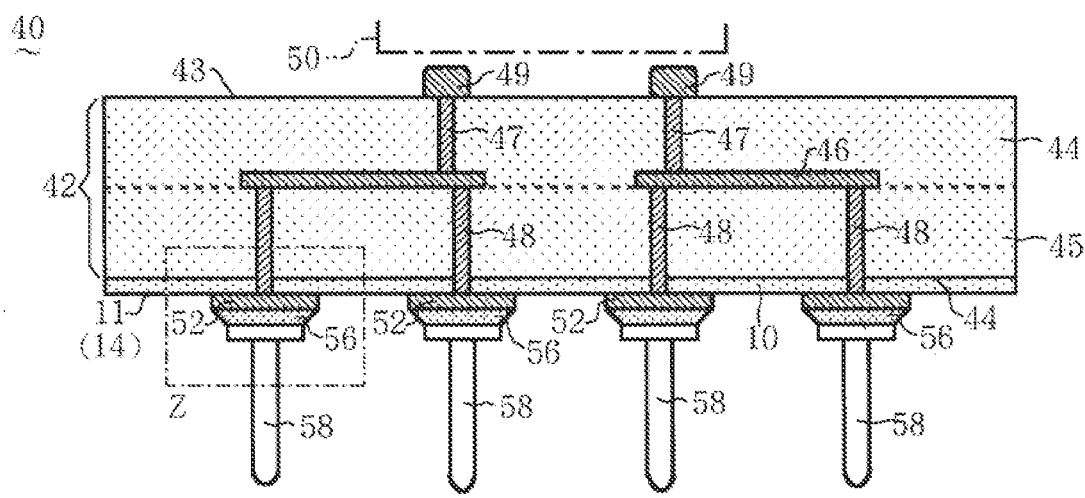
[FIG. 26] Vertical sectional view showing a ceramic substrate according to a further different mode.
Figure 27:
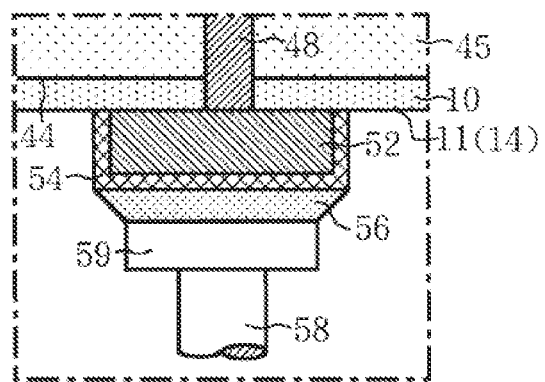
[FIG. 27] Enlarged sectional view of region Z surrounded by the dot-dash line in FIG. 22.

FIG. 26 is a vertical sectional view schematically showing a ceramic substrate 40 according to a further different mode. FIG. 27 is an enlarged view of region Z surrounded by the dot-dash line in FIG. 26.

As shown in FIGS. 26 and 27, the ceramic substrate 40 includes a substrate body 42 having the form of a laminate of ceramic layers 44 and 45 similar to those mentioned above and having a surface 43 and a back surface 44 each having a rectangular shape (square shape or rectangular shape) as viewed in plane, the aforementioned composite material layer 10 formed on the entirety of the back surface (surface) 44 of the substrate body 42, and a plurality of pads (metallization layers) 52 formed on the lower surface (upper surface) 11 of the composite material layer 10 at predetermined positions. The plating layer 14 mentioned above is deposited on the lower surface 11 of the composite material layer 10. Also, the thickness of the pads 52 is thicker than that of the composite material layer 10.

Wiring layers 46 in a predetermined pattern are formed between the ceramic layers 44 and 45 of the substrate body 42, and the wiring layers 46 are connected individually to via conductors 47 and 48 extending through the ceramic layers 44 and 45, respectively. The lower via conductors 48 extend also through the composite material layer 10 and are connected individually to the pads 52. Furthermore, a plurality of electrodes 49 are formed at a central portion of the surface 43 of the substrate body 42 and are connected to the upper via conductors 47, respectively, and to an electronic component 50, such as a semiconductor device, to be mounted on the surface 43.

The wiring layers 46, the via conductors 47 and 48, the electrodes 49, and the pads 52 are formed of, for example, W or Mo.

As shown in FIGS. 26 and 27, a plating layer 54 formed by sequentially depositing Ni and Au plating films is deposited on the surfaces of the pads 52 formed on the lower surface 11 of the composite material layer 10. Heads 59 of lead pins (metal members) 58 in an upright posture are joined to the respective pads 52 via the plating layer 54 and a brazing material 56 similar to that mentioned above. The lead pins 58 are formed of, for example, a Cu alloy such as 194Alloy.

The ceramic substrate 40 can also be manufactured according to the manufacturing method mentioned above.

According to the thus-configured ceramic substrate 40, the composite material layer 10 composed of the ceramic portion 10s, the metal portion 10m, and the glass portion 10g and having a thickness thinner than that of the pads 52 intervenes between the lower ceramic layer 45 and the plurality of pads 52. As a result, after firing, the plating layer 54 deposited on the surfaces of the pads 52 is free of plating separation or a like defect. Also, even though the pads 52 receive shrinkage stress generated as a result of cooling after the heads 59 of the lead pins 58 are brazed to lower surfaces of the pads 52, respectively, via the brazing material 56, separation of the pads 52 from the ceramic layer 45 at or near positions located immediately above the pads 52 can be reliably prevented.

Furthermore, even when the lead pins 58 receive external force along a radial direction, the pads 52 are unlikely to unintendedly separate from the ceramic layer 45. Therefore, while good electrical communication is established, the ceramic substrate 40 can be accurately mounted on a motherboard, such as a printed circuit board, having a mounting section which can be connected to the lead pins 58.

Figure 28:
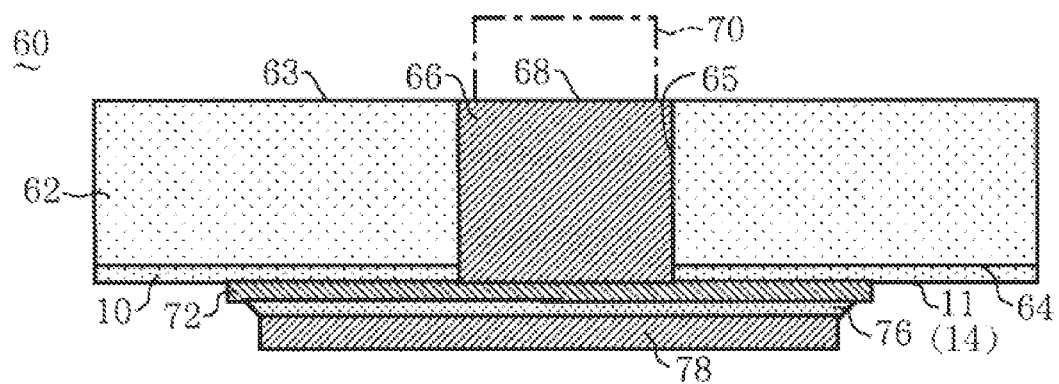
[FIG. 28] Vertical sectional view showing a ceramic substrate according to a still further different mode.

FIG. 28 is a vertical sectional view schematically showing a ceramic substrate 60 according to a still further different mode.

As shown in FIG. 28, the ceramic substrate 60 includes a substrate body 62 formed of ceramic mentioned above and having a surface 63 and a back surface 64 each having a rectangular shape as viewed in plane, the aforementioned composite material layer 10 formed on the entirety of the back surface (surface) 64 of the substrate body 62, and an electrically conductive layer (metallization layer) 72 having a circular shape as viewed in plane, having a thickness thicker than that of the composite material layer 10, and formed in a relatively wide manner on a central portion of the lower surface (upper surface) 11 of the composite material layer 10.

The substrate body 62 has a via conductor (thermal via) 66 adapted to radiate heat and formed in a through-hole (via hole) 65 having a relatively large diameter and extending through the substrate body 62 between the surface 63 and the back surface 64 and through the composite material layer 10, and the via conductor 66 is connected to the electrically conductive layer 72. The plating layer 54 mentioned above is deposited on the surface (bottom surface and circumferential side surface) of the electrically conductive layer 72, and a heat radiation plate (metal member) 78 having a circular shape as viewed in plane is brazed onto the electrically conductive layer 72 via the plating layer 54 and a brazing material 76 similar to that mentioned above.

Also, as shown in FIG. 28, an electronic component having a relatively large heat release value, such as a light-emitting element 70, like LED, or a power semiconductor device, is mounted later on an upper surface 68 of the via conductor 66 exposed at the surface 63 of the substrate body 62.

The via conductor 66 and the electrically conductive layer 72 are formed of W or Mo, and the heat radiation plate 78 is formed of, for example, a Cu alloy or an aluminum alloy. Also, an unillustrated electrode is formed on the surface 63 of the substrate body 62 in a peripheral region around the upper surface 68 of the via conductor 66 and electrically communicates with the light-emitting element 70 via a wire.

The ceramic substrate 60 can also be manufactured according to the manufacturing method mentioned above.

According to the thus-configured ceramic substrate 60, since the composite material layer 10 mentioned above intervenes between the substrate body 62 and the electrically conductive layer 72, after firing, the plating layer 14 deposited on the surface of the electrically conductive layer 72 is free of plating separation or a like defect. Also, even though the electrically conductive layer 72 receives shrinkage stress generated as a result of cooling after the heat radiation plate 78 is brazed to the electrically conductive layer 72 via the brazing material 76, the electrically conductive layer 72 can be reliably prevented from separating from ceramic of the substrate body 62 located in the vicinity of its periphery. Furthermore, even when the heat radiation plate 78 expands and shrinks in the course of heat radiation, the electrically conductive layer 72 becomes unlikely to separate from ceramic of the substrate body 62.

Therefore, heat generated from the light-emitting element 70, such as LED, mounted on the surface 63 of the substrate body 62 can be effectively released to the external environment via the via conductor 66, the electrically conductive layer 72, the brazing material 76, and the heat radiation plate 78.

The through-hole 65, the via conductor 66, the electrically conductive layer 72, and the heat radiation plate 78 may have a rectangular shape, a shape resembling a rectangle, or a polygonal shape of pentagon or higher.

The present invention is not limited to the modes described above.

For example, ceramic used to form the substrate body may be a high-temperature-fired ceramic other than alumina, or a low-temperature-fired ceramic such as glass-ceramic.

Also, the substrate body 2 of the ceramic substrate 1 may assume the form of a laminate of a plurality of ceramic layers and may have a wiring layer formed in a predetermined pattern between the ceramic layers for use in the plating process in the aforementioned manufacturing method.

Furthermore, the lower ceramic layer 2u in the substrate bodies 2a and 2b of the ceramic substrates 1a and 1b (1c) may also have the form of a laminate of upper and lower ceramic layers as in the case mentioned above.

Also, the surface 3 and the back surface 4 of the substrate body 2, etc., may have a square shape as viewed in plane; an arcuately-shaped groove may be formed at each of corners of the square or rectangular shape; and an electrically conductive layer may be formed along an inner wall surface of the groove.

Furthermore, in the case where the substrate body 2, etc., are formed of a low-temperature-fired ceramic such as glass-ceramic, Ag or Cu or an alloy which contains Ag or Cu as a main component is used to form electrical conductors such as the metallization layer 12, the pads 9 and 52, and the electrical conductive layer 72.

Also, the ceramic substrate 40 may be such that: the composite material layer 10 is formed also on the entirety of the surface 43 of the substrate body 42, and the lead pins 58 are joined, in an upright posture via the brazing material 56, onto the pads (metallization layers) 52 disposed at a peripheral portion of the upper surface 11 of the composite material layer 10.

Additionally, the first and second ceramic substrate manufacturing methods are not limited to manufacture of a multi-product aggregation, but can be used for individually manufacturing ceramic substrates.

Industrial Applicability

The present invention can reliably provide a ceramic substrate having a surface of a substrate body which is formed of ceramic and on which an electronic component or the like is to be mounted, and a composite material layer and a metallization layer disposed on the surface, and configured such that: even after firing, a plating layer deposited on the surface of the metallization layer is free of separation; when a metal lid or the like is welded onto a metal frame (metal component) brazed onto the metallization layer, there does not arise separation of the metallization layer from the substrate body caused by shrinkage stress of the metal lid induced by heat of the welding; and strong adhesion is established between the metallization layer and the brazing material.

DESCRIPTION OF REFERENCE NUMERALS 1, 1a to 1c, 40, 60: ceramic substrate
2, 2a, 2b, 42, 62: substrate body
3, 43, 63: surface
3c: corner portion
4, 44, 64: back surface (surface)
6: cavity
10, 10x: composite material layer
10a to 10c: partial composite material layer
10s: ceramic portion
10m: metal portion
10g: glass portion
10t: thickness of composite material layer
11: upper surface
12: metallization layer
12t: thickness of metallization layer
14: plating layer
16, 56, 76: brazing material
18: metal frame (metal member)
20, 25, 28: ceramic green sheet
22: substrate region
23, 24, 26: front surface of green sheet
34: through-hole
36: product region
37: edge portion
52: pad (metallization layer)
58: lead pin (metal member)
72: electrically conductive layer (metallization layer)
78: heat radiation plate (metal member)

What is claimed is:

1. A ceramic substrate comprising
a substrate body formed of ceramic and having a pair of surfaces each assuming a rectangular shape as viewed in plane, and
a metallization layer formed on at least one of the surfaces of the substrate body and adapted to mount a metal member thereon, and
characterized in that
a composite material layer is formed between the surface of the substrate body and the metallization layer and is formed such that a ceramic portion, a metal portion formed of a metal similar to a metal component of the metallization layer or a metal which, together with a metal component of the metallization layer, forms an all proportional solid solution, and a glass portion exist together,
a thickness of the composite material layer is thinner than a thickness of the metallization layer, and
a plating layer is deposited on a surface of the metallization layer.

2. A ceramic substrate according to claim 1, wherein the composite material layer is formed on the entirety of the surface of the substrate body.

3. A ceramic substrate according to claim 1, wherein a cavity having a rectangular shape as viewed in plane opens at a central portion of the surface of the substrate body, and the metallization layer and the composite material layer are formed on the surface of the substrate body at a portion excluding the cavity.

4. A ceramic substrate according to claim 1, wherein a metal frame having a rectangular shape as viewed in plane is joined onto the plating layer via a brazing material.

5. A ceramic substrate according to claim 2, wherein the composite material layer contains the metal portion in an amount of 3 vol % to 20 vol % and the ceramic portion and the glass portion as balance.

6. A ceramic substrate according to claim 3, wherein the composite material layer contains the metal portion in an amount greater than 20 vol % to 80 vol % and the ceramic portion and the glass portion as balance.

7. A ceramic substrate according to claim 1, wherein the composite material layer is a laminate of one or more partial composite material layers which differ in mixing ratio of the ceramic portion, the metal portion, and the glass portion.

8. A ceramic substrate according to claims 1, wherein the composite material layer is formed on the surface of the substrate body at at least four corner portions of the surface.

9. A method of manufacturing a ceramic substrate according to claim 1, characterized by comprising:
a step of forming a composite material layer composed of a ceramic portion, a metal portion, and a glass portion on the entirety of at least one surface of a pair of surfaces, each having a rectangular shape as viewed in plane, of a ceramic green sheet,
a step of forming a metallization layer on an upper surface of the composite material layer, and
a step of depositing a plating layer on a surface of the metallization layer.

10. A method of manufacturing a ceramic substrate according to claim 3, characterized by comprising:
a step of forming a composite material layer composed of a ceramic portion, a metal portion, and a glass portion on the entirety of one surface of a pair of surfaces, each having a rectangular shape as viewed in plane, of an upper ceramic green sheet,
a step of forming a metallization layer on an upper surface of the composite material layer,
a step of punching out, along a thickness direction, a central portion of the upper ceramic green sheet on which the composite material layer and the metallization layer) are formed, thereby forming a through-hole having a rectangular shape as viewed in plane, and
a step of laminating a flat lower ceramic green sheet to cover the through-hole on a back surface of the upper ceramic green sheet, and
a step of depositing a plating layer on the surface of the metallization layer, the surface having a rectangular shape as viewed in plane as a result of performing the step of forming the through-hole.

11. A method of manufacturing a ceramic substrate according to claim 9, characterized in that
   as viewed in plane, the ceramic green sheet is composed of a product region where a plurality of substrate regions which are to become ceramic substrates are juxtaposed adjacently in rows and columns, and a edge portion having the form of a rectangular frame and located around the product region, and
   the metallization layer is formed along four sides of the composite material layer in each of the substrate regions.

12. A method of manufacturing a ceramic substrate according to claim 10, characterized in that
   as viewed in plane, each of the upper and lower ceramic green sheets is composed of a product region where a plurality of substrate regions which are to become ceramic substrates are juxtaposed adjacently in rows and columns, and a edge portion having the form of a rectangular frame and located around the product region, and
   the step of forming the through-hole is performed on the upper ceramic green sheet on which the composite material layer and the metallization layer are formed, at a central portion of each of the substrate regions.

13. A method of manufacturing a ceramic substrate according to claim 9, characterized by having a step of joining a metal frame having the form of a rectangular frame as viewed in plane onto the plating layer via a brazing material after completion of the steps.

* * * * *